US009805783B2

(12) United States Patent
Ito et al.

(10) Patent No.: US 9,805,783 B2
(45) Date of Patent: Oct. 31, 2017

(54) SEMICONDUCTOR DEVICE

(71) Applicant: Micron Technology, Inc., Boise, ID (US)

(72) Inventors: Yutaka Ito, Tokyo (JP); Yuan He, Hachioji (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/281,818

(22) Filed: Sep. 30, 2016

(65) Prior Publication Data

US 2017/0287547 A1    Oct. 5, 2017

(30) Foreign Application Priority Data

Mar. 31, 2016    (JP) ................. 2016-069963

(51) Int. Cl.
*G11C 11/406*    (2006.01)
*G11C 11/408*    (2006.01)

(52) U.S. Cl.
CPC ..... *G11C 11/40611* (2013.01); *G11C 11/4087* (2013.01)

(58) Field of Classification Search
CPC .................. G11C 11/406; G11C 11/40615
USPC ....................................... 365/222
See application file for complete search history.

(56) References Cited

U.S. PATENT DOCUMENTS

| 5,943,283 | A | 8/1999 | Wong et al. |
| 7,830,742 | B2 | 11/2010 | Han |
| 8,625,360 | B2 | 1/2014 | Iwamoto et al. |
| 8,811,100 | B2 | 8/2014 | Ku |
| 9,032,141 | B2 | 5/2015 | Bains et al. |
| 9,117,544 | B2 | 8/2015 | Bains et al. |
| 2004/0130959 | A1* | 7/2004 | Kawaguchi ........... G11C 11/406 365/222 |
| 2014/0006704 | A1 | 1/2014 | Greenfield et al. |

(Continued)

FOREIGN PATENT DOCUMENTS

| JP | 2005-261429 A | 8/2005 |
| JP | 2011-258259 A | 12/2011 |
| JP | 2013-004158 A | 1/2013 |

OTHER PUBLICATIONS

Kim, et al., "Flipping Bits in MemoryWithout Accessing Them: An Experimental Study of DRAM Disturbance Errors".

(Continued)

*Primary Examiner* — Hoai V Ho
*Assistant Examiner* — Minh Dinh
(74) *Attorney, Agent, or Firm* — Dorsey & Whitney LLP

(57) ABSTRACT

A semiconductor device according to an aspect of the present invention has: a plurality of memory cells MC; a plurality of word lines WL each coupled to a corresponding one of the plurality of memory cells MC; and a control circuit that intermittently monitors accesses to the plurality of word lines WL, stores/erases some captured row-addresses in a first number of registers, and detects, by comparison with stored addresses, in response to a first number of accesses to one of the word lines WL in a first period of time. According to the present invention, access histories can be precisely analyzed by a small-scale circuit configuration, and measures against, for example, the Row Hammer problem, etc. can be taken.

14 Claims, 23 Drawing Sheets

(56) References Cited

U.S. PATENT DOCUMENTS

| | | | |
|---|---|---|---|
| 2014/0095786 A1* | 4/2014 | Moon | G11C 11/4078 |
| | | | 711/109 |
| 2014/0241099 A1 | 8/2014 | Seo et al. | |
| 2014/0281206 A1 | 9/2014 | Crawford et al. | |
| 2015/0089326 A1 | 3/2015 | Joo et al. | |
| 2015/0255140 A1 | 9/2015 | Song | |
| 2016/0196863 A1* | 7/2016 | Shin | G11C 11/40611 |
| | | | 365/222 |

OTHER PUBLICATIONS

International Search Report and Written Opinion for PCT Appl. No. PCT/US2016/54878 dated Jan. 19, 2017.

* cited by examiner

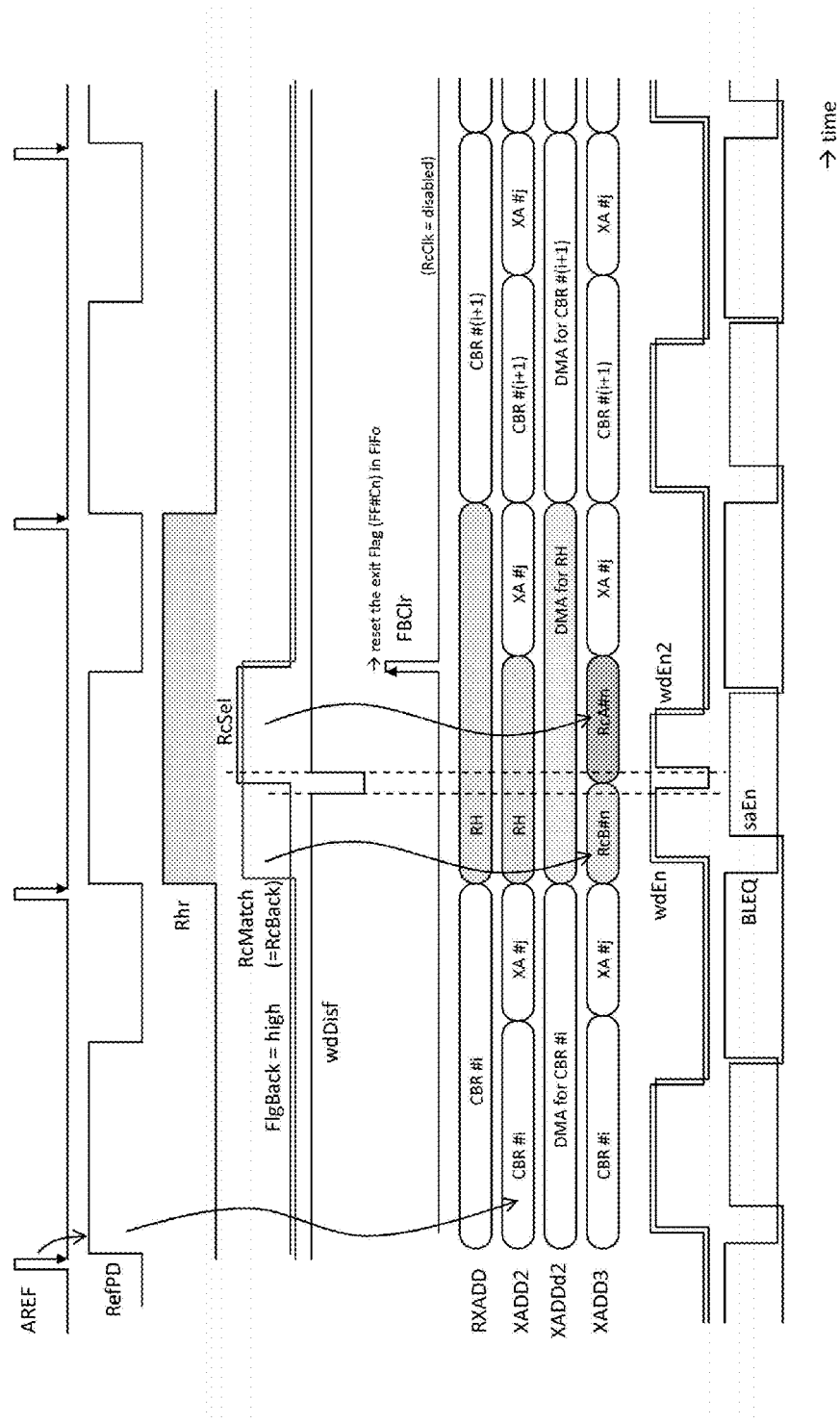

SEMICONDUCTOR DEVICE

CROSS-REFERENCE TO RELATED APPLICATION(S)

This application is based upon and claims the benefit of priority from Japanese Patent Application No. 2016-069963 filed on Mar. 31, 2016, the disclosure of which are incorporated herein in its entirety by reference.

BACKGROUND

The present invention relates to semiconductor devices and particularly relates to a semiconductor device that requires retention of information by refresh operations.

TECHNICAL FIELD

A dynamic random access memory (DRAM), which is a typical semiconductor memory device, stores information by charges accumulated in cell capacitors, and, therefore, the information is lost unless refresh operations are periodically carried out. Therefore, refresh commands indicating refresh operations are periodically issued from a control device, which controls a DRAM (see Patent Literature 1). The refresh commands are issued from the control device at a frequency that all the word lines are certainly refreshed one time in the period of 1 refresh cycle (for example, 64 msec).

CITATION LIST

Patent Literatures

[Patent Literature 1] Japanese Patent Application Laid-Open No. 2011-258259
[Patent Literature 2] Japanese Patent Application Laid-Open No. 2013-004158
[Patent Literature 3] Japanese Patent Application Laid-Open No. 2005-216429
[Patent Literature 4] US Patent Application Laid-open No. 2014/0006704
[Patent Literature 5] US Patent Application Laid-Open No. 2014/0281206

Non-Patent Literature

[Non-Patent Literature 1] "Flipping Bits in Memory Without Accessing Them: An Experimental Study of DRAM Disturbance Errors", ISCA in June 2014.

SUMMARY OF THE INVENTION

Technical Problem

However, depending on the access history to memory cells, the information retention characteristics of predetermined memory cells are reduced in some cases. If the information retention time of the predetermined memory cells is reduced to less than 1 refresh cycle, part of the information may be lost even when the refresh commands are issued at the frequency that all the word lines are refreshed one time in the period of 1 refresh cycle.

Such a problem has been present in DRAMs from before. This is a phenomenon in which cell leaks due to crystal defects, foreign matters, etc., which are present in memory cells by some degree, emerge due to interference from adjacent word lines or noise caused along with memory access. Therefore, a measure such as providing a disturb counter, which counts/stores the number of times of access, for each memory section and, if it becomes larger than a predetermined threshold value, increasing the refresh frequency of the section has been carried out (see Patent Literature 2). However, miniaturization of DRAMs has advanced to become a 2x-nm process generation, the Row Hammer phenomenon has emerged, and, as a result, it cannot be handled any more. Row Hammer is a critical problem against the reliability of DRAMs and is a serious problem in which adjacent cell charges are lost by minor carriers, which are generated when a word line is activated/deactivated, and errors are quickly caused. Since a paper about Row Hammer was disclosed in International Symposium on Computer Architecture (ISCA) of June 2014, this is widely known in the field of computers (see Non-Patent Literature 1). In fact, the number of times or a Row Hammer threshold value for reaching an error due to activation/deactivation of the word line has already become 100,000 times or less in the 20-nm process generation, and it is difficult to maintain correct operations without a measure in terms of circuit in DRAM or some measure on a memory system side.

A method that expands the above mentioned disturb counter for each row address, monitors the row address (hammer address) at which the number of times of access has reached the Row Hammer threshold value, and subjects an adjacent word line(s) to additional refresh has been proposed (see Patent Literature 4). However, the memory space of a memory system is much bigger than a single DRAM, an extremely large scale circuit has to be mounted in order to analyze the history of access to such memory cells, and the cost thereof is not realistic. This is even more so in a large-scale system such as a server.

On the other hand, focusing on the fact that the appearance frequency of hammer addresses is inevitably increased according to the Row Hammer threshold thereof and the upper limit value of the number of times of row access (the number of Active commands) which can be executed in a refresh cycle, there has been proposed a method of capturing row addresses at random timing and at an appropriate frequency and also proposed Patent about probabilistic memory control (see Patent Literature 5). According to this, according to the randomly captured row address, only additional refresh with respect to the adjacent word line thereof is carried out. Therefore, the circuit scale can be extremely reduced, and, according to the probability of hitting the hammer addresses, practically high reliability can be obtained.

A method of analyzing access histories that can obtain necessary and sufficient reliability for capturing hammer addresses that may be implemented in a small scale circuit mounted in a DRAM is desired.

Solution to Problem

A semiconductor device according to a first aspect of the present invention is provided with: a plurality of memory cells; a plurality of word lines each coupled to a corresponding one of the plurality of memory cells; a control circuit configured to detect accesses to the plurality of word lines intermittently and to detect if first number of accesses have been issued to one of the plurality of word lines in a first period of time.

A semiconductor device according to another aspect of the present invention is provided with: a plurality of word lines having mutually different allocated addresses; an address output circuit configured to output the address; a row decoder configured to access any of the plurality of word lines indicated by the address in response to a first control signal; a first latch circuit configured to latch the address in response to a second control signal different from the first control signal; and a first comparator circuit configured to compare the address output from the address output circuit and the address latched by the first latch circuit in response to the second control signal and, if the addresses match, activate a third control signal.

Advantageous Effect of Invention

According to the present invention, access histories can be precisely analyzed by a small-scale circuit configuration.

BRIEF DESCRIPTION OF THE DRAWINGS

FIG. 9C is an operation waveform chart for describing a copy operation from an additional region to a normal array.

DETAILED DESCRIPTION OF PREFERRED EMBODIMENTS

Hereinafter, some embodiments of the present invention will be described in detail with reference to accompanying drawings.

First Embodiment

Figure 1A:
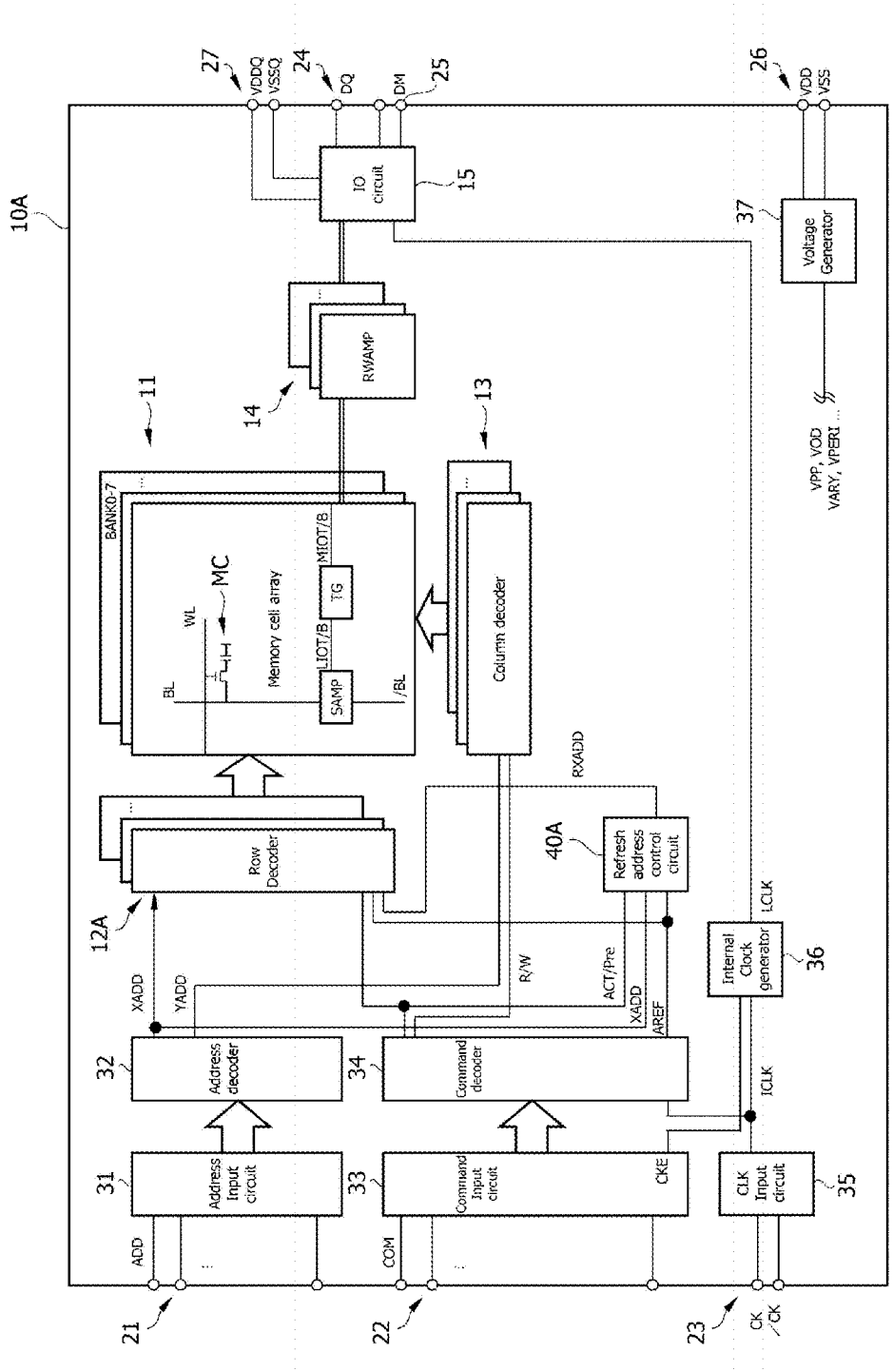
FIG. 1A is a block diagram showing an overall configuration of a semiconductor device 10A according to a first embodiment of the present invention.

FIG. 1A is a block diagram showing an overall configuration of a semiconductor device 10A according to a first embodiment of the present invention.

The semiconductor device 10A according to the present embodiment is a synchronous DRAM (SDRAM) of, for example, a Double Data Rate 3 (DDR3) type integrated on a single semiconductor chip and has a memory cell array 11. The memory cell array 11 is provided with a plurality of word lines WL and a plurality of bit lines BL and has a configuration in which memory cells MC are disposed at the intersection points thereof. Selection of the word lines WL is carried out by a row decoder 12A, and selection of bit lines BL is carried out by a column decoder 13. The memory cell array 11, the row decoder 12A, the column decoder 13, and a read/write amplifier 14 are divided into eight banks BANK0 to BANK7.

Moreover, the semiconductor device 10A is provided with address terminals 21, command terminals 22, clock terminals 23, data terminals 24, data mask terminals 25, and power supply terminals 26 and 27 as external terminals.

The address terminals 21 are the terminals to which address signals ADD are input from outside. The address signals ADD are supplied to an address output circuit 32 via an address input circuit 31. The address output circuit 32 supplies a row address XADD to the row decoder 12A and supplies a column address YADD to the column decoder 13. Moreover, the row address XADD is supplied also to a refresh address control circuit 40A.

The command terminals 22 are the terminals to which command signals COM are input from outside. The command signals COM are supplied to a command decoder 34 via a command input circuit 33. The command decoder 34 is a circuit which generates various internal commands by decoding the command signals COM. Examples of the internal commands include active signals ACT, pre-charge signals Pre, read/write signals R/W, and refresh signals AREF.

The active signal ACT is a pulse signal which is activated when the command signal COM is indicating row access (active command). When the active signal ACT is activated, the row decoder 12A of a specified bank address is activated. As a result, the word line WL specified by the row address XADD is selected and activated. The pre-charge signal Pre is a pulse signal which is activated when the command signal COM is indicating pre-charge. When the pre-charge signal Pre is activated, the row decoder 12A of the specified bank address and the word line WL specified by the row address XADD controlled thereby are deactivated.

The read/write signal R/W is a pulse signal which is activated when the command signal COM is indicating column access (read command or write command). When the read/write signal R/W is activated, the column decoder 13 is activated. As a result, the bit line BL specified by the column address YADD is selected.

Therefore, if the active command and the read command are input and if the row address XADD and the column address YADD are input in synchronization with them, read data is read from the memory cell MC specified by the row address XADD and the column address YADD. The read data DQ is output from the data terminal 24 to outside via a sense amplifier SAMP, a transfer gate TG, the read/write amplifier 14, and an input/output circuit 15.

On the other hand, if the active command and the write command are input, if the row address XADD and the column address YADD are input in synchronization with them, and, then, if write data DQ is input to the data terminal 24, the write data DQ is supplied to the memory cell array 11 via the input/output circuit 15, the read/write amplifier 14, the transfer gate TG, and the sense amplifier SAMP and is written to the memory cell MC specified by the row address XADD and the column address YADD.

The refresh signal AREF is a pulse signal which is activated when the command signal COM is indicating an auto-refresh command. Also, when the command signal COM is indicating a self-refresh entry command, the refresh signal AREF is activated, is activated once immediately after command input, thereafter, is cyclically activated at desired internal timing, and a refresh state is continued. By a self-refresh exit command thereafter, the activation of the refresh signal AREF is stopped and returns to an IDLE state. The refresh signal AREF is supplied to the refresh address control circuit 40A. The refresh address control circuit 40A supplies a refreshing row address RXADD to the row decoder 12A, thereby activating the predetermined word line WL contained in the memory cell array 11, thereby refreshing the information of the corresponding memory cell MC. Other than the refresh signal AREF, the active signal ACT, the row address XADD, etc. are supplied to the refresh address control circuit 40A. Details of the refresh address control circuit 40A will be described later.

External clock signals CK and /CK are input to the clock terminals 23. The external clock signals CK and the external clock signals /CK are mutually complementary signals, and both of them are supplied to the clock input circuit 35. The clock input circuit 35 generates internal clock signals ICLK based on the external clock signals CK and /CK. The internal clock signals ICLK are supplied to the command decoder 34, an internal clock generator 36, etc. The internal clock generator 36 generates internal clock signals LCLK, which control the operation timing of the input/output circuit 15.

The data mask terminals 25 are the terminals to which data mask signals DM are input. When the data mask signal DM is activated, overwrite of corresponding data is prohibited.

The power supply terminals 26 are the terminals to which power supply potentials VDD and VSS are supplied. The power supply potentials VDD and VSS supplied to the power supply terminals 26 are supplied to a voltage generator 37. The voltage generator 37 generates various internal potentials VPP, VOD, VARY, VPERI, etc. based on the power supply potentials VDD and VSS. The internal potential VPP is the potential mainly used in the row decoder 12A, the internal potentials VOD and VARY are the potentials used in the sense amplifier SAMP in the memory cell array 11, and the internal potential VPERI is the potential used in many other circuit blocks.

The power supply terminals 27 are the terminals to which power supply potentials VDDQ and VSSQ are supplied. The power supply potentials VDDQ and VSSQ supplied to the power supply terminals 27 are supplied to the input/output circuit 15. The power supply potentials VDDQ and VSSQ are the same potentials as the power supply potentials VDD and VSS, respectively, which are supplied to the power supply terminals 26. However, the dedicated power supply potentials VDDQ and VSSQ are used for the input/output circuit 15 so that power supply noise generated by the input/output circuit 15 does not propagate to other circuit blocks.

Figure 1B:
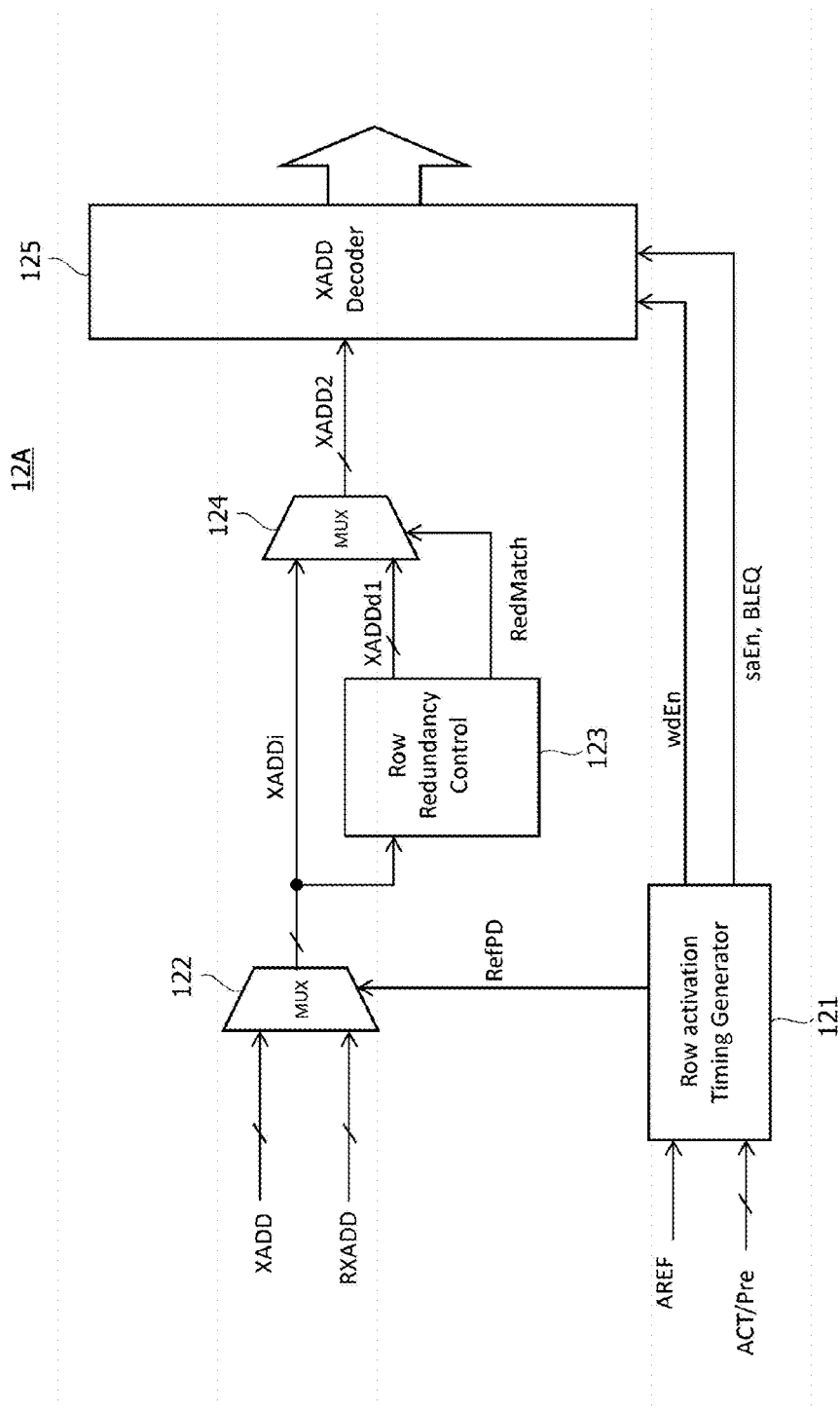
FIG. 1B is a block diagram showing a configuration of a row decoder 12A.

FIG. 1B is a block diagram showing a configuration of the row decoder 12A.

As shown in FIG. 1B, the row decoder 12A is provided with a row activation timing generator 121, which receives the refresh signal AREF, the active signal ACT, and the pre-charge signal Pre and generates a state signal RefPD, a word-line actuation signal wdEn, a sense-amplifier actuation signal saEn, and a bit-line equalize signal BLEQ. The state signal RefPD is supplied to a multiplexer 122, which selects one of the row address XADD and the refreshing row address RXADD. An address XADDi selected by the multiplexer 122 is supplied to a row redundancy control circuit 123. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 124; wherein, if the hit signal RedMatch is not activated, the address XADDi is selected; and, if the control judge signal RedMatch is activated, the address XADDd1 is selected. The selected address XADD2 is supplied to an X address decoder 125. The X address decoder 125 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Figure 2A:
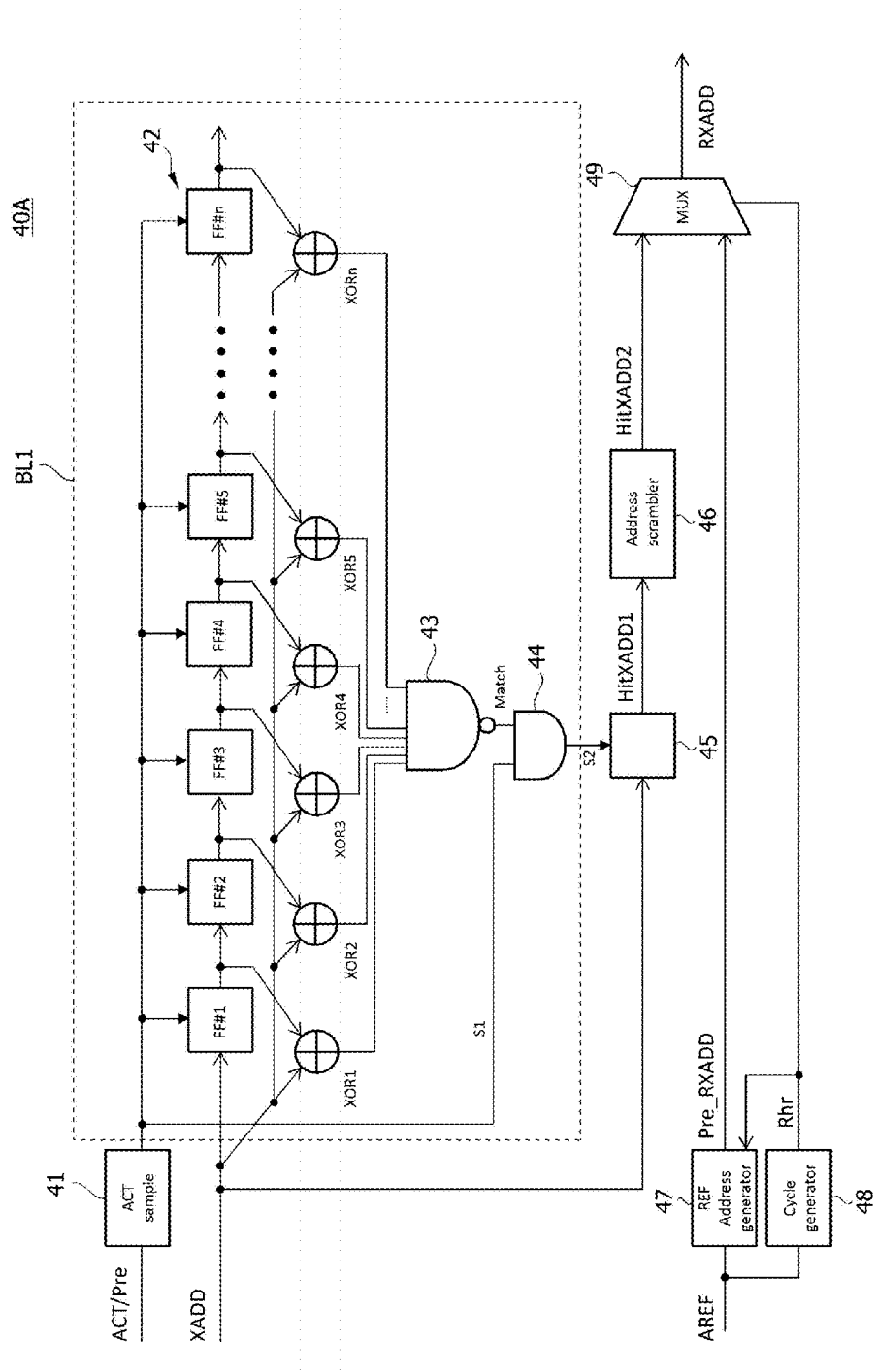
FIG. 2A is a block diagram showing a configuration of a refresh address control circuit 40A.

FIG. 2A is a block diagram showing a configuration of the refresh address control circuit 40A.

As shown in FIG. 2A, the refresh address control circuit 40A is provided with a sampling signal generator 41, which generates a first sampling signal S1, and a shift register 42, which carries out shift operations synchronized with the first sampling signal S1.

Figure 2B:
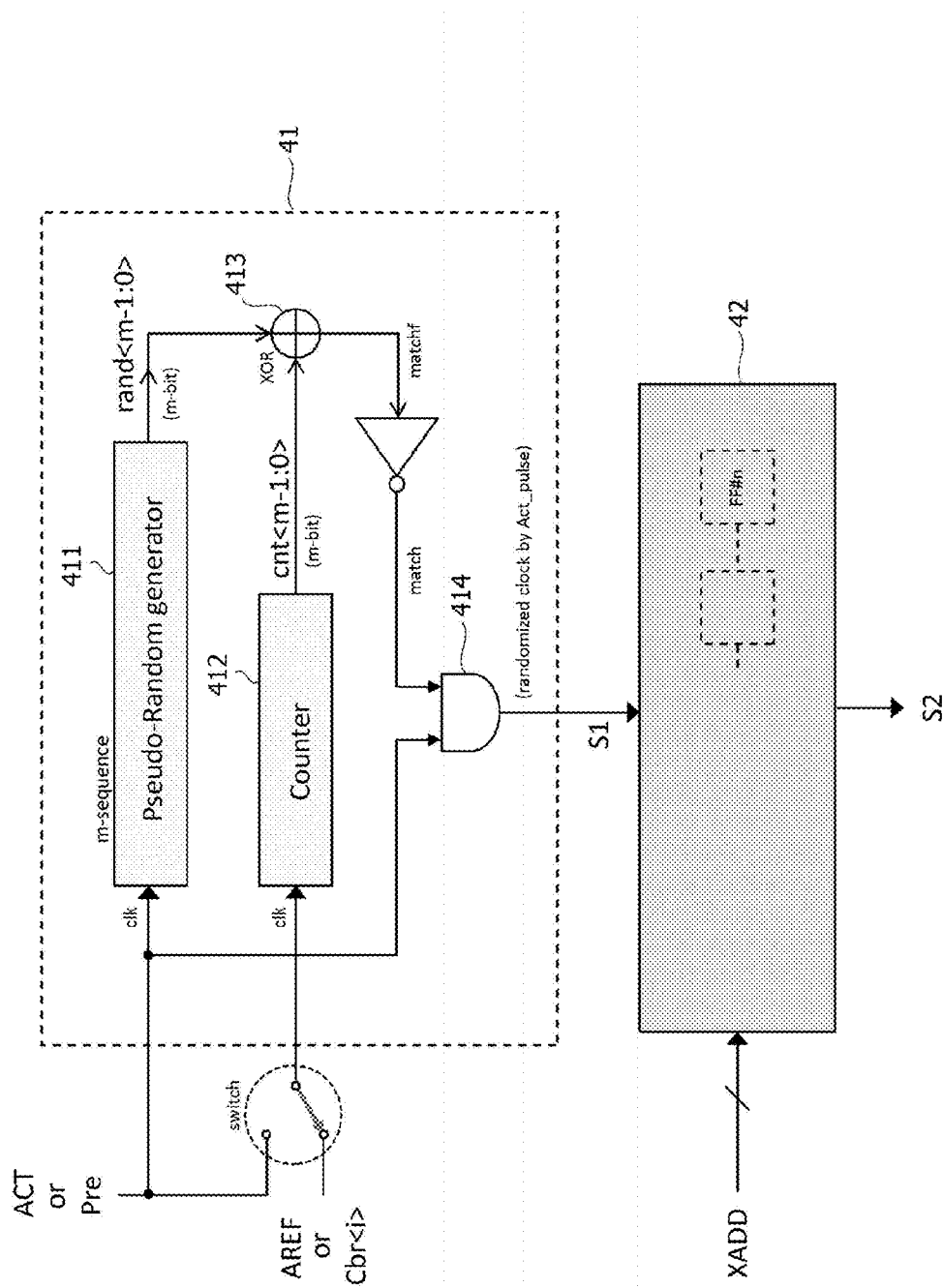
FIG. 2B is a block diagram showing a configuration according to an example of a sampling signal generator 41.
Figure 2C:
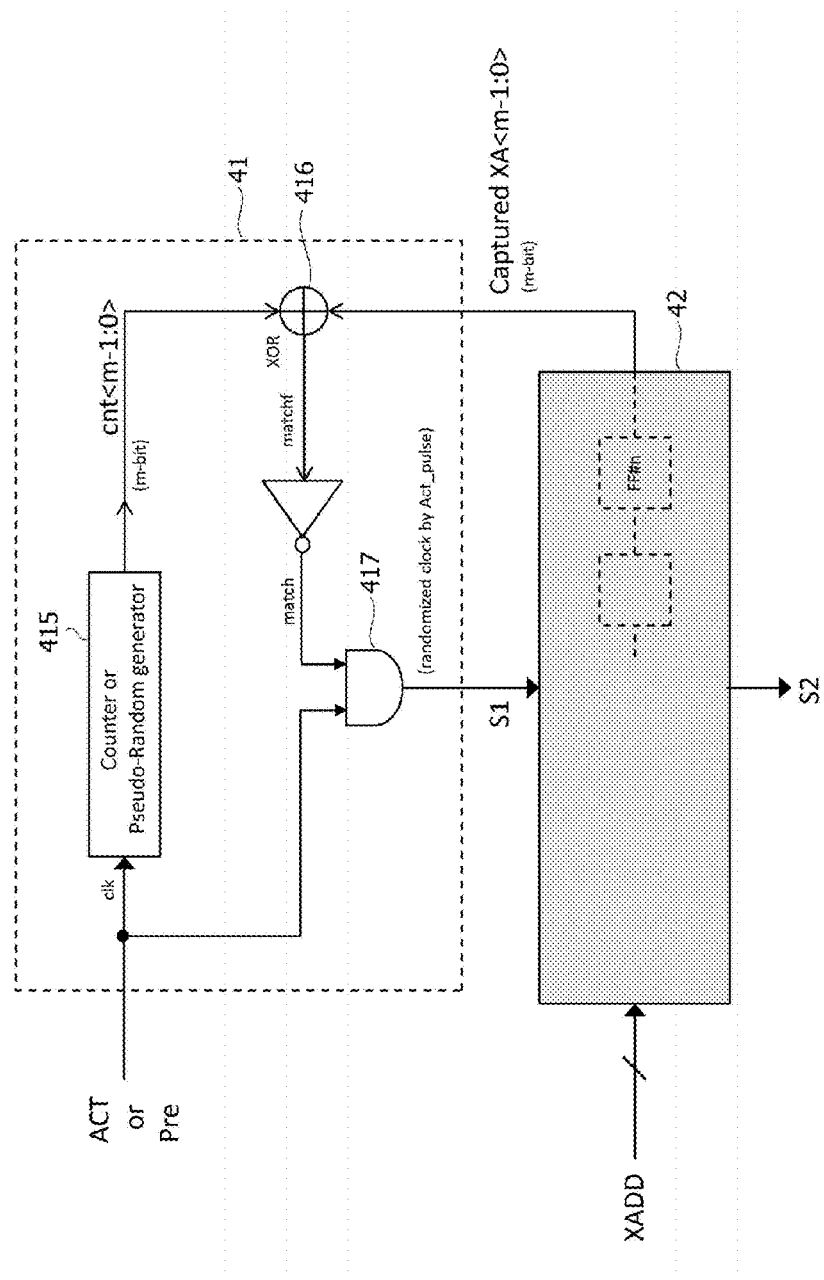
FIG. 2C is a block diagram showing a configuration according to another example of the sampling signal generator 41.

The sampling signal generator 41 randomly extracts the active signal ACT or the pre-charge signal Pre, which is generated in response to an active command or a pre-charge command, and outputs the signal as a first sampling signal S1. Meanwhile, the random extraction is configured so that an optimum sampling rate with which the reliability of Row Hammer refresh is the highest is present depending on the appearance frequency of hammer addresses and the number of stages (depth) of the shift register 42 and that desired reliability is obtained. For example, as shown in FIG. 2B, the sampling signal generator 41 can generate the first sampling signal S1 by: using a pseudo-random generator 411 and a counter circuit 412, which are subjected to clocking by, for example, the active signal ACT, the pre-charge signal Pre, or the refresh signal AREF; synthesizing an m-bit random value rand<m−1:0> output from the pseudo-random generator 411 and a m-bit count value cnt<m−1:0> output from the counter circuit 412 by an exclusive OR gate circuit 413; and, if all of the m-bits mutually match, inputting a match signal match, which is at a high level, and the active signal ACT or the pre-charge signal PRE to an AND gate circuit 414. Alternatively, as shown in FIG. 2C, the first sampling signal S1 can be also generated by: using a counter circuit 415, which is subjected to clocking by, for example, the active signal ACT or the pre-charge signal Pre; synthesizing a m-bit count value cnt<m−1:0> output from the counter circuit 415 and m-bits XA<m−1:0> of a captured address value by an exclusive OR gate circuit 416; and, if all of the m-bits mutually match, inputting the match signal match, which is at the high level, and the active signal ACT or the pre-charge signal Pre to an AND gate circuit 417. In this case, instead of the counter circuit 412, the pseudo-random generator 411 may be used. In either case, the probability that the m-bit outputs match is $1/2^m$, and the sampling rate thereof becomes $2^m$.

Herein, the most important thing is to impart randomness and support all the appearance patterns of hammer addresses. The optimum sampling rate described above is merely a mean value. For example, a case that a hammer address periodically appears at a rate of one time per 50 active commands and that the depth of the shift register 42 provided in the refresh address control circuit (FIG. 2A) is 4 is taken into consideration. Herein, if the sampling rate of the first sampling signal S1 is 1 (if all the row addresses are to be retrieved into the shift register 42), the number of the retrieved addresses is extremely large, and, therefore, many match signals are generated (by randomly appearing row addresses). Hammer addresses are reliably retrieved into the shift register 42; however, since the window width for capturing row addresses is only 4, the matching signal "match" is not enabled by hitting the hammer addresses. Even if the sampling rate is somewhat increased to 2 or 3, this situation is not changed. Meanwhile, if the sampling rate is largely increased to 25 (a fixed value), the window width for capturing row addresses is expanded to 100, and results in a situation in which the match signal may be enabled by hitting the hammer addresses. Also, since there is a relation that the appearance frequency of hammer addresses is exactly two times the sampling rate, the hit rate thereof may become extremely high probability as if synchronization with hammer address has occurred. However, since they have a periodic appearance pattern and a constant sampling rate, hit may never occur as if mis-synchronization has occurred. If the appearance pattern of hammer addresses is random (even with a constant sampling rate), probabilistically, hammer addresses may be hit, but not always. Therefore, it is important to carry out random sampling to enable capturing of the hammer addresses having various appearance patterns. Herein, furthermore, a case in which the sampling rate is 100, which is large, is taken into consideration. The window width for capturing row-address becomes 400, which is eight times the appearance frequency of hammer addresses. The hammer addresses can be captured by carrying out random sampling, and the capture probability thereof (hit rate) can be also increased by providing the shift register 42 like the refresh address control circuit (FIG. 2A) of the present embodiment. However, if the sampling rate is excessively increased, the number of times per se of capturing the hammer addresses is reduced since the number of active commands which can be entered within a refresh cycle has an upper limit. This is disadvantageous to increase reliability. Reversely, if the sampling rate is too small, as described above, the number of times of capturing thereof increases; however, the capture probability (hit rate) decreases. Thus, the end reliability is determined by a product of "the hammer's hit rate" and "the number of times of capturing hammer address", therefore, the sampling rate has an optimum value with which reliability is the highest according to the balance of them. In order to exert performance by the refresh address control circuit (FIG. 2A) of the present embodiment, the first sampling signal S1 is extremely important.

The shift register 42 has a configuration in which n-stages of flip-flop circuits FF#1 to FF#n, which latch the row addresses XADD, are in cascade connection. In other words, an output node of the flip-flop circuit of a former stage is connected to an input node of the flip-flop circuit of a latter stage. The first sampling signal S1 is commonly input to clock nodes of the flip-flop circuits FF#1 to FF#n. As a result, when the first sampling signal S1 is activated, the current row address XADD is latched by the flip-flop circuit FF#1 of a first stage, and the row addresses XADD latched by the flip-flop circuits FF#1 to FF#n−1 are respectively shifted to the flip-flop circuits FF#2 to FF#n of next stages. The row address XADD latched by the flip-flop circuit F#n, which is a last stage, is discarded in response to activation of the first sampling signal S1.

The row addresses XADD latched by the flip-flop circuits FF#1 to FF#n are supplied to first-side input nodes of corresponding comparator circuits XOR1 to XORn, respectively. The current row address XADD is supplied to second-side input nodes of the comparator circuits XOR1 to XORn. As a result, if the current row address XADD matches any of the row addresses XADD latched by the flip-flop circuits FF#1 to FF#n, the output of the comparator circuit XOR1 to XORn thereof is activated to a low level, and, therefore, the match signal Match output from a NAND gate circuit 43 is activated to a high level.

The match signal Match and the first sampling signal S1 are supplied to an AND gate circuit 44. Therefore, if both of the match signal Match and the first sampling signal S1 are activated to the high level, a second sampling signal S2 output from the AND gate circuit 44 is activated to the high level. More specifically, if the row address XADD supplied when the first sampling signal S1 is activated within past n-times matches the row address XADD supplied when the first sampling signal S1 is currently activated, the second sampling signal S2 is activated. In other words, the access to the word lines WL is intermittently monitored, and, if the access to the same word line WL is captured two times or more within a predetermined period of time, the second sampling signal S2 is activated.

The second sampling signal S2 is supplied to a latch circuit 45. The latch circuit 45 latches the current row address XADD in response to the second sampling signal S2 and outputs this to an address scrambler 46 as a row address HitXADD1.

Therefore, the row address HitXADD1 output from the latch circuit 45 can be considered to be the row address XADD of the word line WL having a high access frequency. As a matter of course, since the first sampling signal S1 is intermittently activated with respect to the active signal ACT, the row address XADD of the word line WL having a high access frequency is not always latched by the latch circuit 45. However, the higher the access frequency of the row address XADD of the word line WL, the higher the probability thereof of being latched by the latch circuit 45; therefore, the row address XADD of the word line WL which is accessed by an extremely high frequency that reduces the information retention characteristics of the memory cells MC connected to the adjacent word line WL is latched by the latch circuit 45 with an extremely high probability.

Based on the row address HitXADD1 output from the latch circuit 45, the address scrambler 46 converts that to a row address HitXADD2 of the word line WL affected by the highly-frequent access. In other words, if the row address HitXADD1 is an aggressor address, the row address HitXADD2 is a victim address. In many cases, the row address HitXADD2, which is the victim address, is the address of the word line WL which is adjacent to the word line WL accessed by the row address HitXADD1, which is the aggressor address.

Figure 2D:
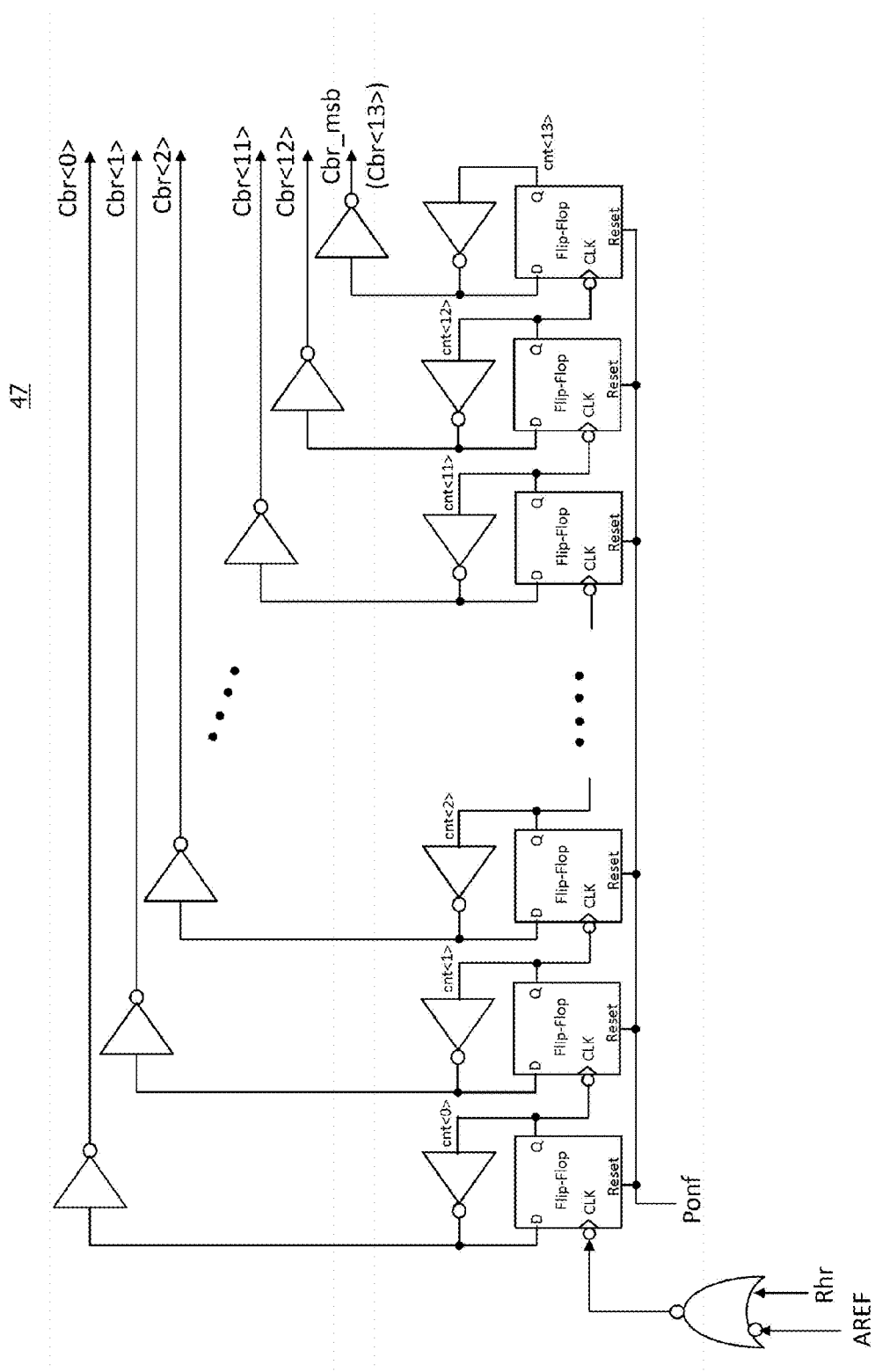
FIG. 2D is a block diagram showing a configuration of a refresh counter 47.

As shown in FIG. 2A, the refresh address control circuit 40A further contains a refresh counter 47 and a refresh cycle generator 48. As shown in FIG. 2D, the refresh counter 47 is a circuit which updates a row address Pre_RXADD when the refresh signal AREF is activated. The row address Pre_RXADD is the address of the word line corresponding to the memory cell MC to be refreshed in response to the refresh signal AREF. However, if an interrupt cycle signal Rhr generated by the refresh cycle generator 48 is activated, update of the row address Pre_RXADD by the refresh counter 47 is prohibited even if the refresh signal AREF is activated.

Figure 2E:
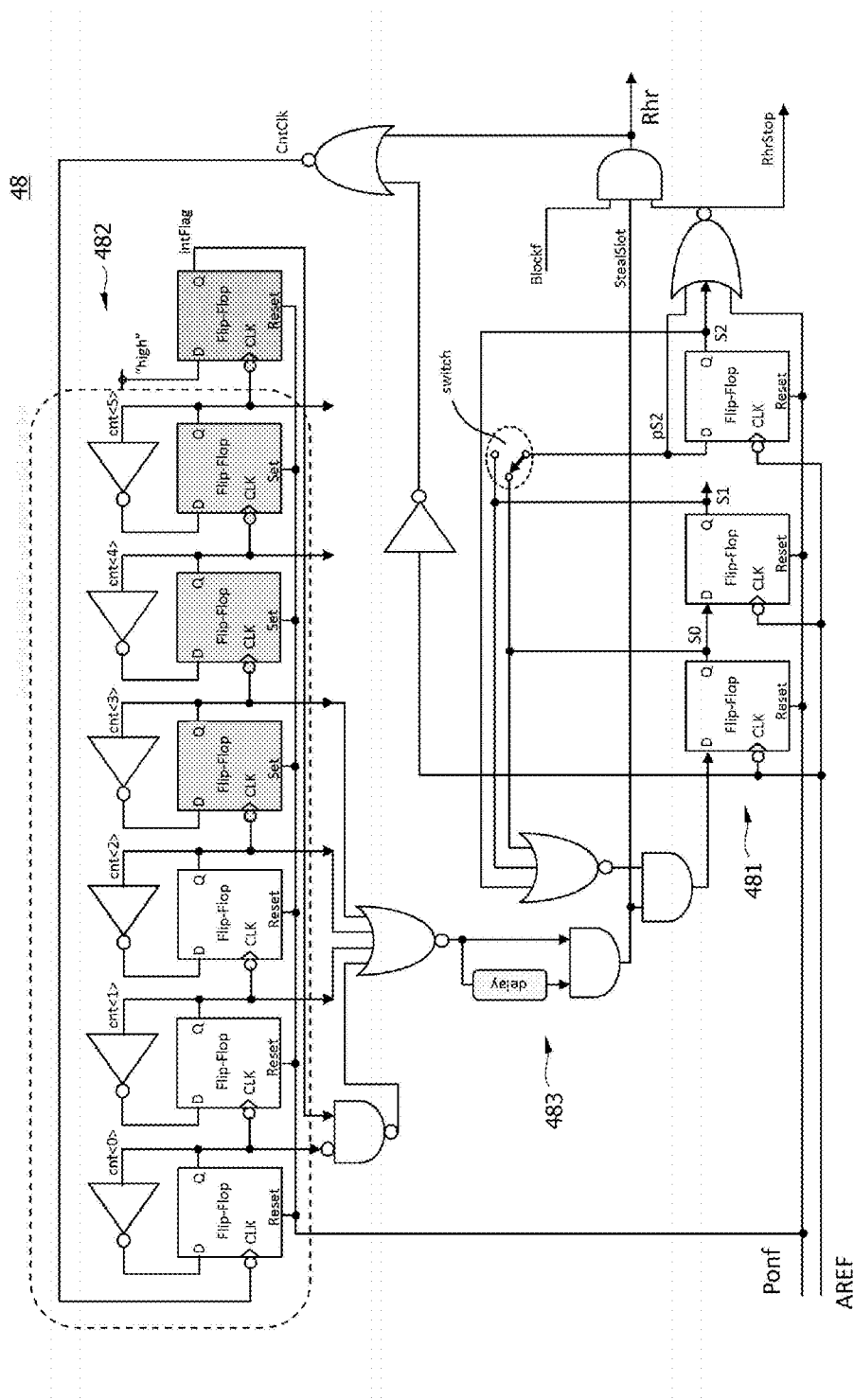
FIG. 2E is a block diagram showing a configuration according to an example of a refresh cycle generator 48.
Figure 2F:
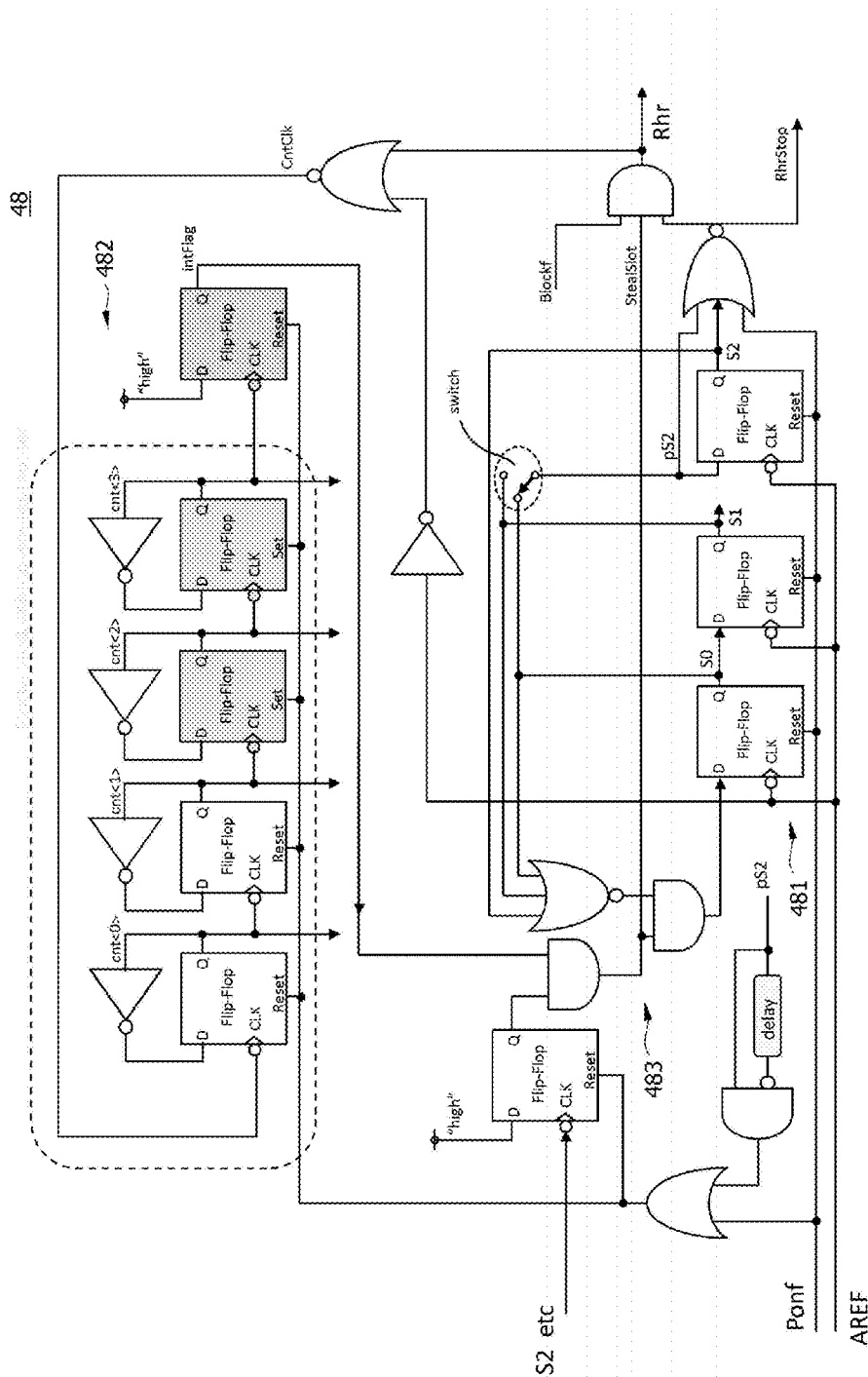
FIG. 2F is a block diagram showing a configuration according to another example of the refresh cycle generator 48.

The refresh cycle generator 48 activates the interrupt cycle signal Rhr in response to a predetermined times of activation of the refresh signal AREF. For example, as shown in FIG. 2E, the refresh cycle generator 48 is composed of a counter circuit 481, which uses the refresh signal AREF as a clock synchronization signal, a shift register 482, and a combination logic circuit 483. As a modification example, the refresh cycle generator 48 may be configured to be activated in response to the second sampling signal S2. For example, it is configured as shown in FIG. 2F. According to this, the frequency of later-described additional refresh operations can be reduced. The interrupt cycle signal Rhr is supplied to the refresh counter 47 and a multiplexer 49.

The multiplexer 49 receives the row address HitXADD2 output from the address scrambler 46 and the row address Pre_RXADD output from the refresh counter 47 and outputs either one of them to the row decoder 12A as the row address RXADD of a refresh target. The selection thereof is carried out by the interrupt cycle signal Rhr; wherein, if the interrupt cycle signal Rhr is deactivated, the row address Pre_RX-ADD output from the refresh counter 47 is selected; and, if the interrupt cycle signal Rhr is activated, the row address HitXADD2 output from the address scrambler 46 is selected; thereby switching and carrying out a normal refresh and a Row Hammer refresh.

Figure 3:
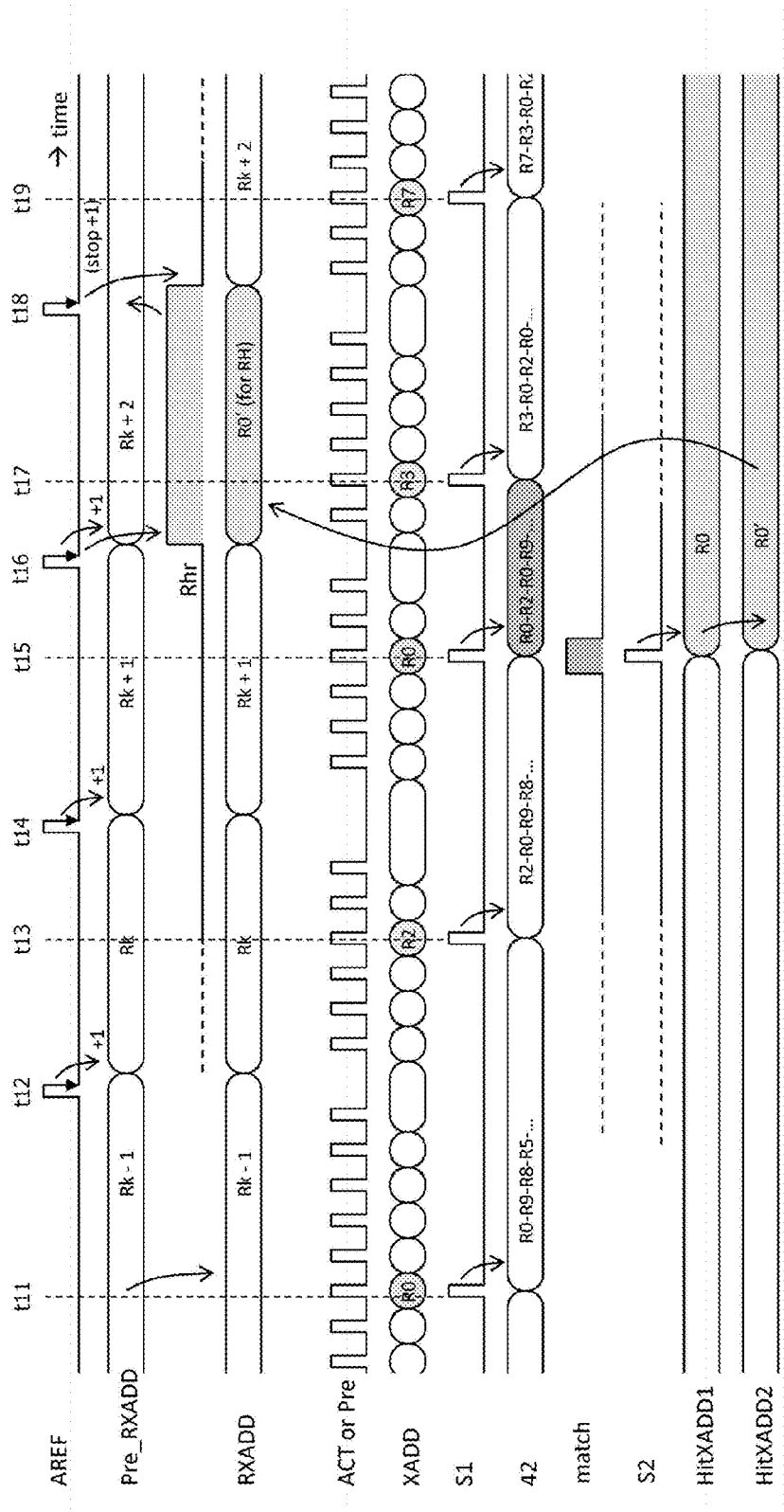
FIG. 3 is a timing chart for describing operations of the refresh address control circuit 40A.

FIG. 3 is a timing chart for describing the operations of the refresh address control circuit 40A.

In the example shown in FIG. 3, the refresh signal AREF is activated at time t12, t14, t16, and t18, and the first sampling signal S1 is activated at time t11, t13, t15, t17, and t19.

When the first sampling signal S1 is activated at the time t11, the value R0 of XADD input at this timing is input to the shift register 42, and a shift operation is carried out. In this case, since the second sampling signal S2 is not activated, when the refresh signal AREF is activated at the time t12, normal refresh is carried out. In this case, the count value of the refresh counter 47 is incremented from Rk−1 to Rk.

Similarly, when the first sampling signal S1 is activated at the time t13, the value R2 of XADD input at this timing is input to the shift register 42, and a shift operation is carried out. Also in this case, since the second sampling signal S2 is not activated, when the refresh signal AREF is activated at the time t14, normal refresh is carried out. In this case, the count value of the refresh counter 47 is incremented from Rk to Rk+1.

Similarly, when the first sampling signal S1 is activated at the time t15, since the value R0 of XADD input at this timing has already been stored in the shift register 42, the second sampling signal S2 is activated. Then, in response to the second sampling signal S2, the current row address R0 is latched by the latch circuit 45, and a row address R0' related to the row address R0 is output from the address scrambler 46.

At the time t16, the refresh signal AREF is activated, and Rk+2 is supplied from the refresh counter 47 as the row address Pre_RXADD. In this case, since the interrupt cycle signal Rhr is in an active state, instead of the row address Rk+2 which is output of the refresh counter 47, the row address R0' which is output of the address scrambler 46 is output from the multiplexer 49. As a result, the word line WL corresponding to the row address R0' is accessed, and a refresh operation is carried out. Moreover, since the interrupt cycle signal Rhr is activated, the update operation of the refresh counter 47 is stopped.

Then, when the first sampling signal S1 is activated at the time t17, the value R3 of XADD input at this timing is input to the shift register 42, and a shift operation is carried out. In this case, since the second sampling signal S2 is not activated, when the refresh signal AREF is activated at the time t18, normal refresh is carried out. In this case, the refresh counter 47 is in a state in which the increment operation thereof is stopped, and the count value thereof is fixed to Rk+2.

In this manner, in the present embodiment, the access responding to the active signal ACT is intermittently monitored by using the first sampling signal S1; and, if occurrence of a predetermined times of access with respect to the same word line WL in a predetermined period of time is detected, the row address HitXADD1 of the word line WL is latched by the latch circuit 45. The row address HitX-ADD1 is converted to the row address HitXADD2 by the address scrambler 46 and, in response to activation of the interrupt cycle signal Rhr, is supplied to the row decoder 12A. As a result, the word line WL which is related to (mainly adjacent to) the word line WL' having a high access frequency is activated. Therefore, the memory cell MC, which may have critically decreased data retention characteristics, can be additionally refreshed.

Figure 4:
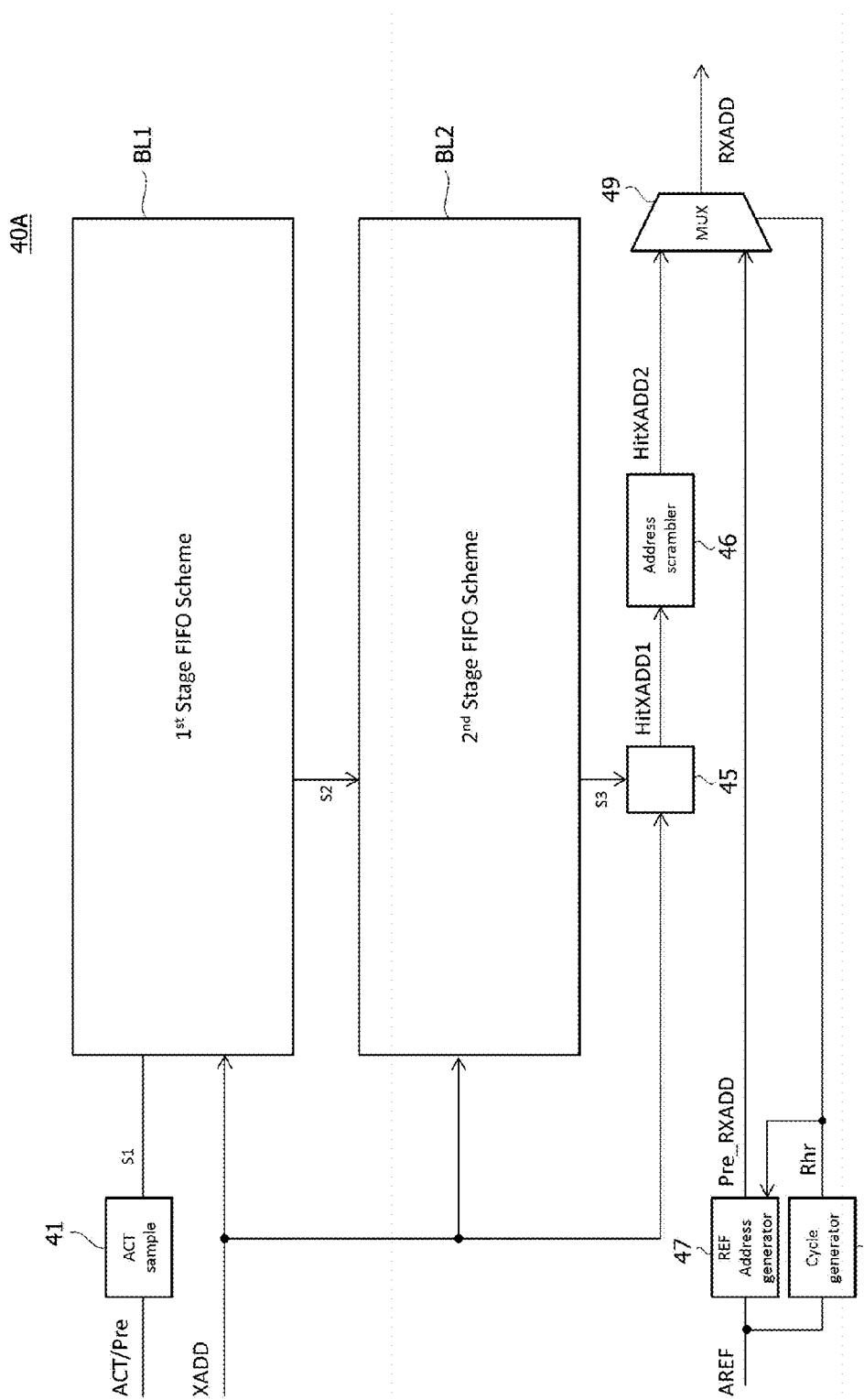
FIG. 4 is a block diagram showing a configuration of the refresh address control circuit 40A according to a modification example.

FIG. 4 is a block diagram showing a configuration of the refresh address control circuit 40A according to a modification example.

The refresh address control circuit 40A shown in FIG. 4 is different from the refresh address control circuit 40A shown in FIG. 2A in a point that two detected blocks BL1 and BL2 are provided. Herein, the detected block BL1 is a circuit block represented by a reference sign BL1 shown in FIG. 2A and is the circuit which intermittently monitors the access responding to the active signal ACT by using the first sampling signal S1 and, if occurrence of the access of a predetermined number of times with respect to the same word line WL within a predetermined period of time is detected, activates the second sampling signal S2.

Except that the second sampling signal S2 is used instead of the first sampling signal S1, the detected block BL2 has the same circuit configuration as the detected block BL1 shown in FIG. 2A. The detected block BL2 monitors the access responding to the active signal ACT by using the second sampling signal S2 and, if occurrence of the access of a predetermined number of times with respect to the same word line WL within a predetermined period of time is detected, activates a third sampling signal S3.

The third sampling signal S3 is supplied to the latch circuit 45. As a result, when the third sampling signal S3 is activated, the latch circuit 45 latches the current row address XADD and outputs that to the address scrambler 46 as the row address HitXADD1.

According to such a configuration, only the row address XADD to which the frequency of access is a high frequency is latched by the latch circuit 45. Therefore, the probability of carrying out a wasteful refresh operation with respect to the memory cell MC, which does not require an additional refresh operation, can be reduced.

Second Embodiment

Figure 5A:
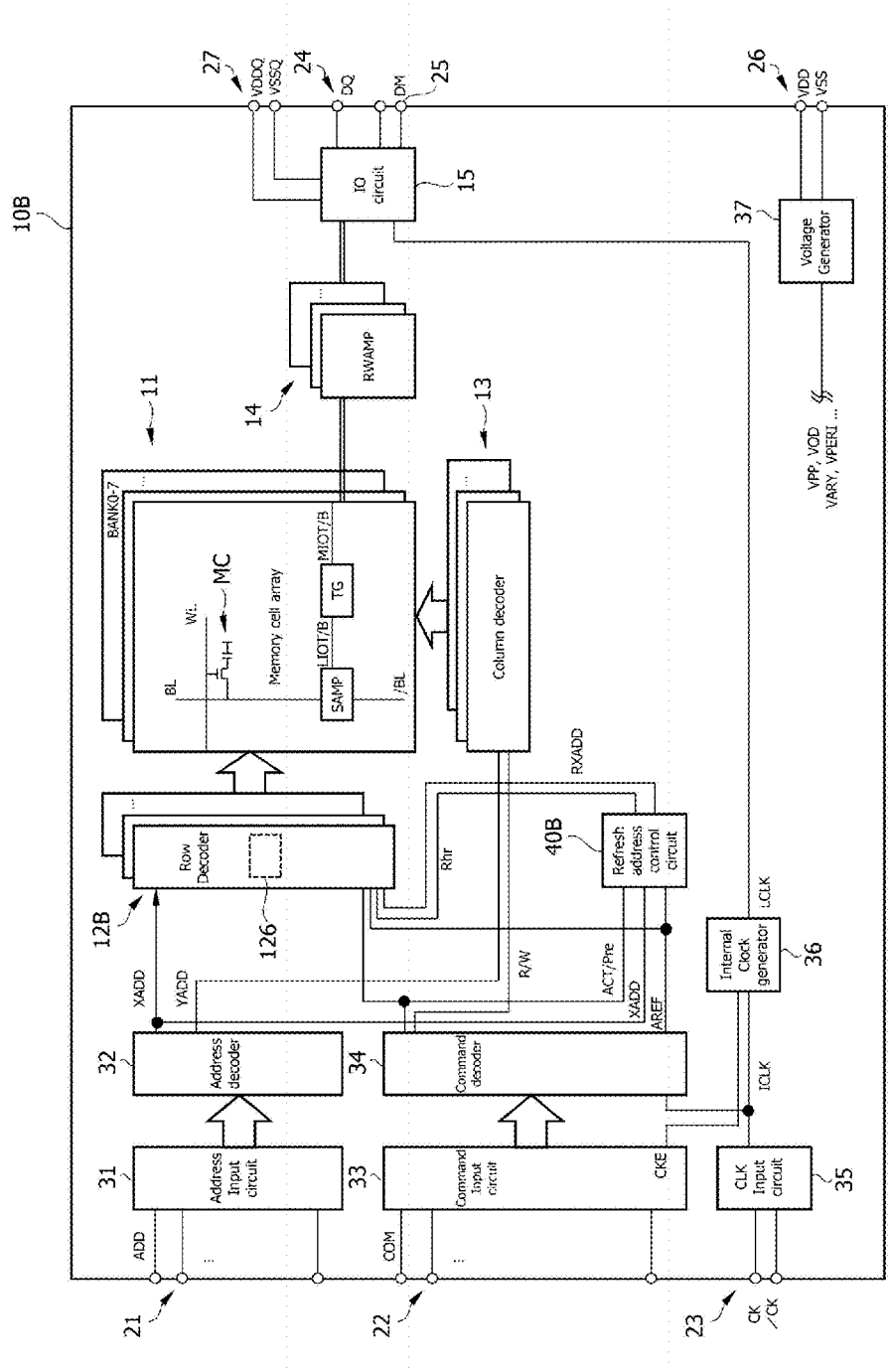
FIG. 5A is a block diagram showing an overall configuration of a semiconductor device 10B according to a second embodiment of the present invention.

FIG. 5A is a block diagram showing an overall configuration of a semiconductor device 10B according to a second embodiment of the present invention. In order to take measures against the Row Hammer problem, in the first embodiment of the present invention, the additional refresh operation (Row Hammer refresh) is carried out with respect to the adjacent address (victim address) of the row address selected by the refresh address control circuit 40A and having a high appearance frequency. On the other hand, in the second embodiment of the present invention described by FIG. 5A and thereafter, a row-copy operation is carried out with respect to the row address (aggressor address) selected by a refresh address control circuit 40B and having a high appearance frequency or with respect to an adjacent address (victim address) thereof The semiconductor device 10B according to the present embodiment is different from the semiconductor device 10A according to the first embodiment in a point that the refresh address control circuit 40A shown in FIG. 1 is replaced by the refresh address control circuit 40B and in a point that the row decoder 12A is replaced by a row decoder 12B. Since other configurations are basically the same as the semiconductor device 10A according to the first embodiment, the same configurations are denoted by the same reference signs, and redundant descriptions are omitted.

Figure 5B:
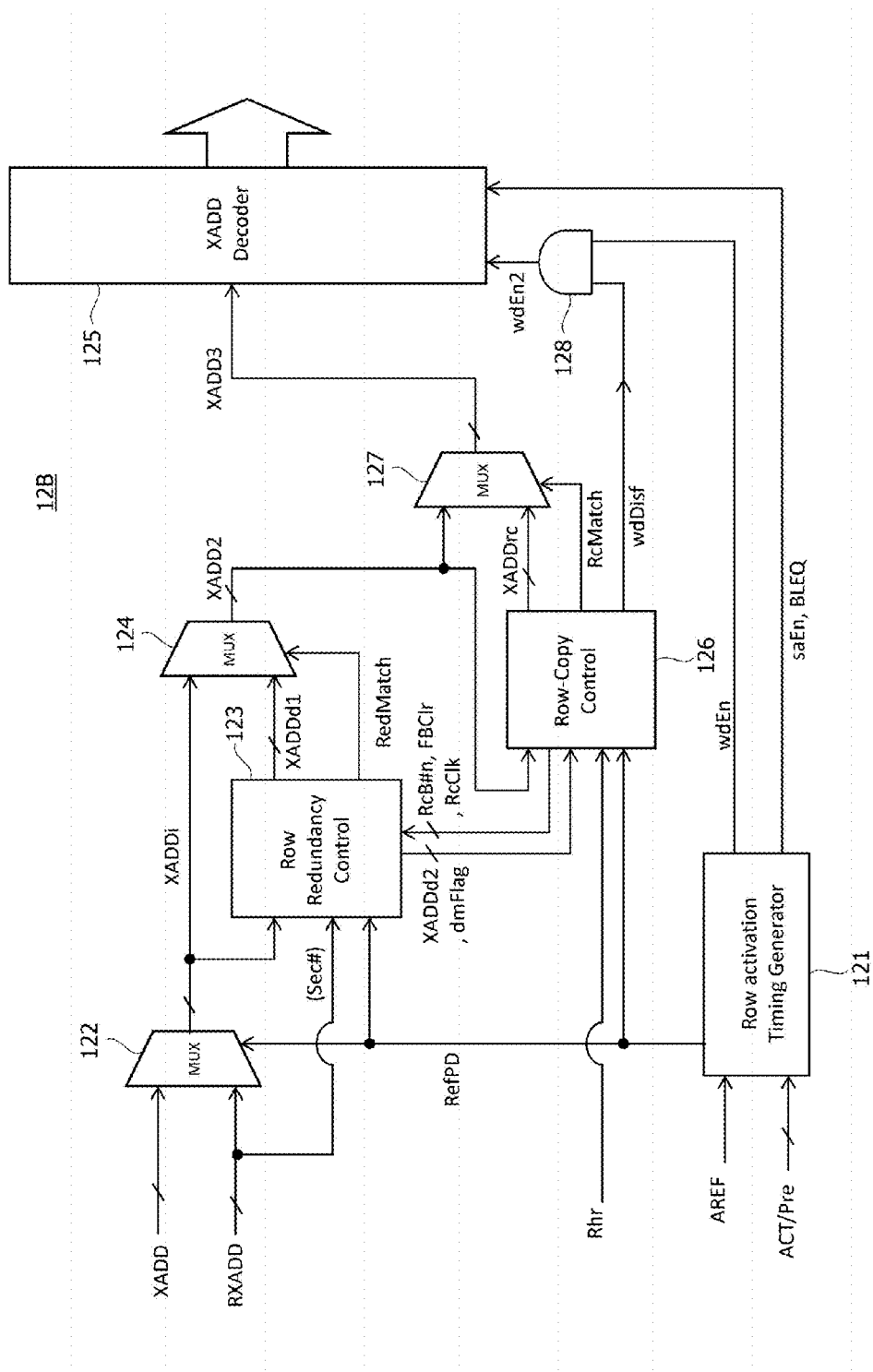
FIG. 5B is a block diagram showing a configuration of a row decoder 12B.

FIG. 5B is a block diagram showing a configuration of the row decoder 12B used in the present embodiment. As shown in FIG. 5B, the row decoder 12B used in the present embodiment is provided with a Row-copy control circuit 126, and a row address XADDrc output from the Row-copy control circuit 126 and a normal row address XADD2 are supplied to a multiplexer 127. The selection by the multiplexer 127 is carried out by a row-copy match signal RcMatch output from the Row-copy control circuit 126. A row address XADD3 output from the multiplexer 127 is supplied to the X address decoder 125. Moreover, a word-line deactivation signal wdDisf output from the Row-copy control circuit 126 is supplied to an AND gate circuit 128 together with a word-line actuation signal wdEn, and a word-line actuation signal wdEn2, which is output thereof, is supplied to the X address decoder 125.

Figure 6:
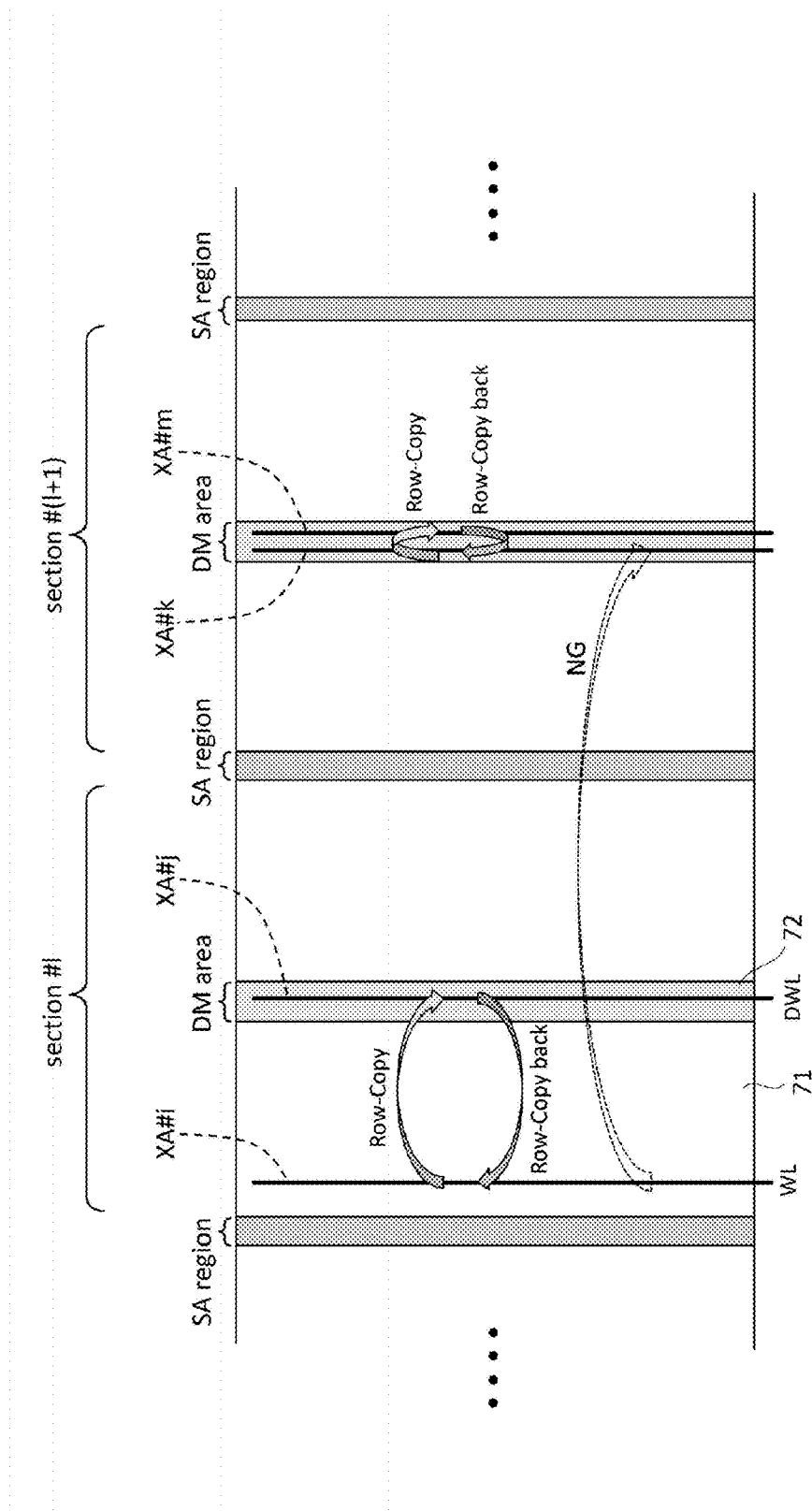
FIG. 6 is a schematic diagram showing each bank configuration of a memory cell array 11.

FIG. 6 is a schematic diagram showing the configuration of each bank of the memory cell array 11 and general ideas of row copy. The row copy refers to the operation of activating a word line and a sense amplifier, activating a different word line within the same section after cell data is read to a bit line, and copying the memory cell data of the previously activated word line to the memory cells of the subsequently activated word line (see Patent Literature 3). According to the memory array configuration of a DRAM, since the memory cells connected to the word lines of the same section share a sense amplifier and a bit line, copy can be carried out quickly between the word lines without reading the cell data to outside the memory array.

As shown in FIG. 6, each bank of the memory cell array 11 is composed of a plurality of continued Sections, which are the regions separated by sense-amplifier circuit regions. For example, any of the Sections in the bank is selected by a number of upper bits of the row address XADD, and any of the word lines in the Section is selected by a lower bit(s) thereof.

Each of array regions Section#I has a normal array region 71 and an additional array region 72. The normal array region 71 is a region composed of the word line WL to which a normal row address is allocated. On the other hand, a normal row address is not allocated to the additional array region 72 in an initial state of manufacturing, and the additional array region 72 is a redundant region which has an internally expanded row address and can be accessed by activating that. For example, in each of the array regions Section #I, operations as described below are carried out. If the word line of the normal array region 71 has a defect, the row address thereof is allocated to an additional word line DWL, which has been confirmed to operate correctly in a testing step, by the row redundancy control circuit. Alternatively, when a later-described row-copy operation is carried out, the row address of the normal region is dynamically allocated to the additional word line DWL, which has been unused in the row redundancy control, by the Row-copy control circuit 126. In addition to copying the memory cell data of the word line WL selected in the process of memory access to the cell data of the additional word line DWL selected in the additional array region 72, which is in the same section, the row address thereof is dynamically allocated to the additional word line DWL in the additional array region 72, thereby replacing the row address during the row access. If the additional word line DWL of the additional array region 72 does not have vacancy, inverse replacement of returning the row address allocated to the additional word line DWL in the additional array region 72 to the word line WL in the corresponding normal array region 71 and returning the cell data to the word line WL of the normal array region 71 is carried out by a row-copy back operation, thereby ensuring vacancy in the additional array region 72 for a next row-copy operation.

Figure 7:
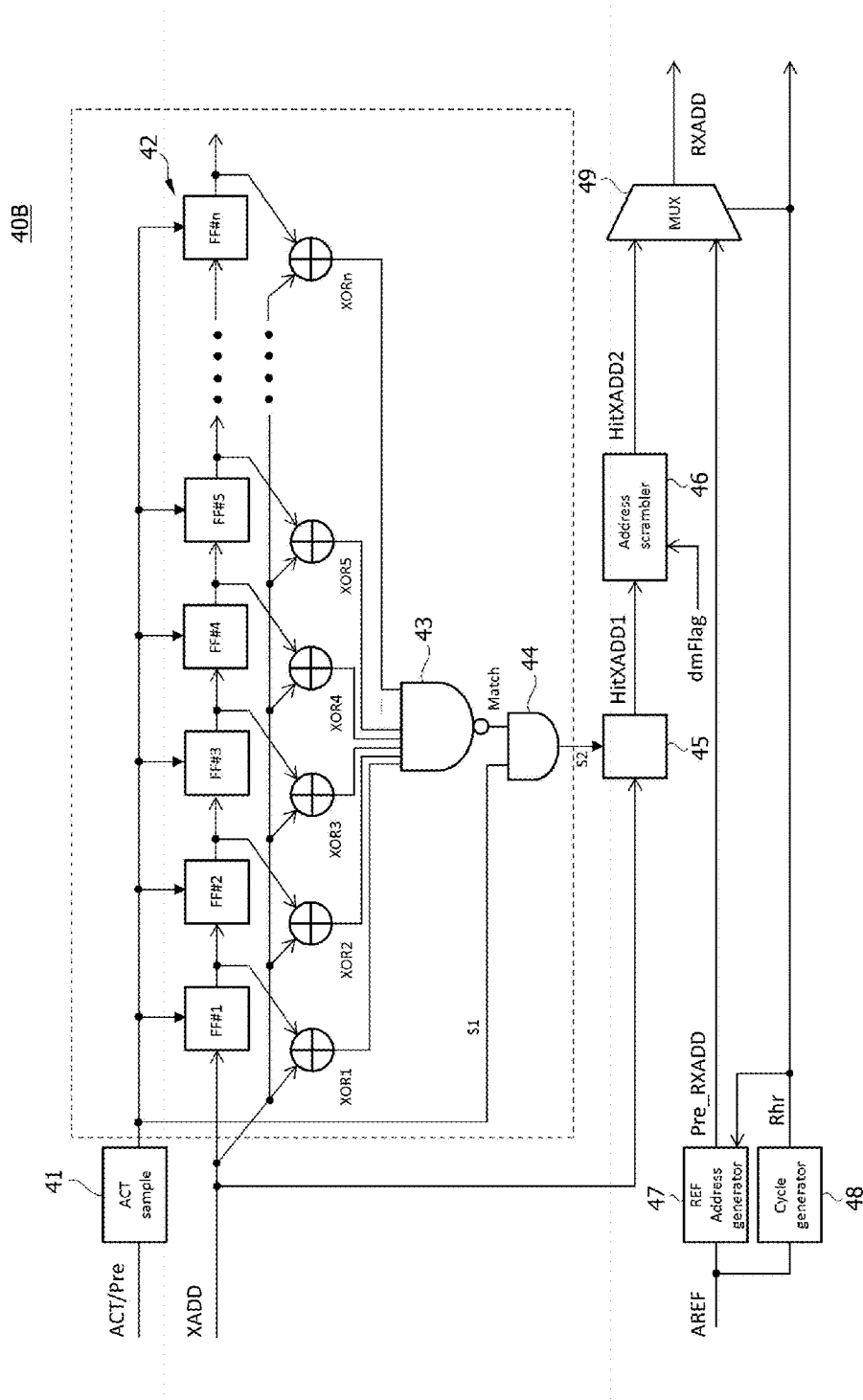
FIG. 7 is a block diagram showing a configuration of a refresh address control circuit 40B.

For example, as a target of a row-copy operation, if a row address having a high appearance frequency, in other words, an aggressor row address of Row Hammer is selected in the refresh address control circuit 40B, the aggressor word line is eliminated from the adjacence of the victim word line by re-allocation of the row address thereof; therefore, advancement of the Row Hammer phenomenon can be stopped. Thus, this is another countermeasure method which is different from the additional refresh with respect to the adjacent word line of an aggressor row address and from the Row hammer refresh. Meanwhile, the victim word line(s) adjacent to the aggressor word line is only one line in one side of the aggressor word line in some cases, but depend on process techniques, in other words, memory cell structures and are two lines in both sides in some cases. In that case, the additional refresh operation with respect to the victim word line is required to be carried out two times; however, the row-copy operation of the aggressor address has advantages that a measure can be taken by one-time operation of copying the aggressor word line and that there is no need to take the adjacent address into consideration. Generally, the calculation of the adjacent address(es) is complicated, for example, in a case in which a physical row address is transferred to a different Section by the row redundancy control, in a case in which the addresses are at a boundary of a normal array region and an additional array region not having continuity of the addresses, and particularly in a case that the addresses range to two lines in both sides. Meanwhile, recently, along with miniaturization of DRAMs, capacitance of a memory cell tends to be reduced, and a charge amount of the memory cell is becoming closer to a charge limit minimally required for stable operations after the 2×(nm) process generation. Therefore, the array voltage reduced little by little along with miniaturization has reversely tended to increase, and, particularly, ensuring reliability (HC tolerance) of the transistors driven by a word-line voltage at an increasing level VPP, which is a highest voltage, has become a big problem. Among them, a large number of word-driver circuits disposed are the most serious problem in ensuring reliability. However, if not activated by word-line selection (row access), the transistor does not undergo switching operations, and the HC deterioration amount thereof can be therefore ignored. More specifically, if the frequency of activating the individual word drivers is reduced by row-access distribution, there is room to significantly improve the lifetime of the word-drivers. At this point, the row-copy operation proposed herein dynamically changes the row address allocation with respect to the row address having a high appearance frequency, in other words, the word line to which accesses have been concentrated, therefore ensures distribution of row accesses, and can largely contribute to ensure reliability of the word driver-circuit, etc. On the other hand, if the adjacent word line of the row address having a high frequency, in other words, the victim address of Row Hammer is selected as a target of the row copy, the time to stop advancement of the Row Hammer phenomenon is generated by re-allocation of the row address in addition to replace the Row Hammer refresh shown in the first embodiment of the present invention. Therefore, when a hit-rate of Row-hammer address is very high, there is an advantage that the effect of improving Row Hammer tolerance becomes higher than that of the simple Row Hammer refresh. Moreover, although it will be described later in detail, the row-copy control of the present embodiment has a hammer address detection ability as well as the refresh address control circuit of the first embodiment (FIG. 2A or FIG. 7). Therefore, the time during which advancement of the Row Hammer phenomenon can be stopped can be extended as the appearance probability of the hammer address becomes higher. If it is implemented in combination with the refresh address control circuit of the first embodiment, an extremely high hammer-address detection ability like that of two-stage FIFO configuration (FIG. 4) can be also provided.

FIG. 7 is a block diagram showing a configuration of the refresh address control circuit 40B.

As shown in FIG. 7, the refresh address control circuit 40B has a configuration approximately the same as the refresh address control circuit 40A shown in FIG. 2A. In addition to that, the refresh address control circuit 40B is provided with a mechanism which can select whether an output address has been through the address scrambler 46 or not by a flag signal dmFlag indicating the state of an additional array region. Although it will be described later in detail, for example, if the flag signal dmFlag is activated, it indicates that the selected additional region has (unused) vacancy, and the address (aggressor address) which has not been through the address scrambler 46 is selected. Since other configurations are basically the same as the semiconductor device 10A according to the first embodiment, the same configurations are denoted by the same reference signs, and redundant descriptions are omitted.

Note that, as described by using FIG. 4, not only the detected block BL1, but the two detected blocks BL1 and BL2 may be used.

FIG. 5B is a circuit configuration of the row decoder 12B of the second embodiment. With respect to the row decoder 12A (FIG. 1B) of the first embodiment, the Row-copy control circuit 126 is added and disposed; however, the basic flow of row access is not changed. The row address XADD2, which has passed through the row redundancy control circuit 123, is switched to a re-replaced address XADDrc appropriately at operation timing by the row-copy control circuit 126.

First, in the (first) multiplexer 122, if during a refresh operation, the state signal RefPD indicating a refresh operation period is activated, and the input row address XADD is switched to a refreshing row address RXADD. If not during refresh, the row address from an input buffer passes therethrough without change, and the row address XADDi is input to the row redundancy control circuit 123 of a next stage.

In the row redundancy control circuit 123, whether the row address XADDi is the address which has been replaced to an additional array region in a manufacturing step (test step) or not is judged. The row redundancy control circuit 123 contains a massive ROM block composed of laser fuses, electric fuses, etc., wherein the row addresses detected to be defective in various test steps are recorded as replacement addresses. The input row address XADDi is compared with the many replacement addresses stored in the ROM block. If a matching address is present, the control judge signal RedMatch is activated, and the output of the multiplexer 124 is switched to the replacement address, in other words, the address XADDd1 of the replaced additional array region. If the control judge signal RedMatch is not activated, the output is not switched, and XADDi is selected. Then, the row address XADD2, which has passed through the (second) multiplexer 124, is input to the Row-copy control circuit 126 of a next stage.

A function of receiving the refreshing row address RXADD from the refresh address control circuit 40B and decoding the enable state of the additional region (ROM block) of the same section of the row address is added to the row redundancy control circuit 123 of the present embodiment. As needed, the flag signal dmFlag indicating the state whether the additional region is usable or not and a usable row address XADDd2 are supplied to the Row-copy control circuit 126.

In the Row-copy control circuit (FIG. 8A), depending on the operation state thereof at the point, whether the address is an address to be re-replaced for row-copy/copy-back, an address to be inversely replaced, or an address simply replaced like the row redundancy control is judged, and the output row address XADDrc is output. Moreover, at desired timing, the row-copy match signal RcMatch is activated, the (third) multiplexer 127 switches to allow the input address XADD2 to pass therethrough without change or select XADDrc from the Row-copy control circuit 126, and the row address XADD3 is supplied to the X address decoder 125. At the same time, the word-line deactivation signal wdDisf is activated, and a series of row-copy operations is realized.

Figure 9A:
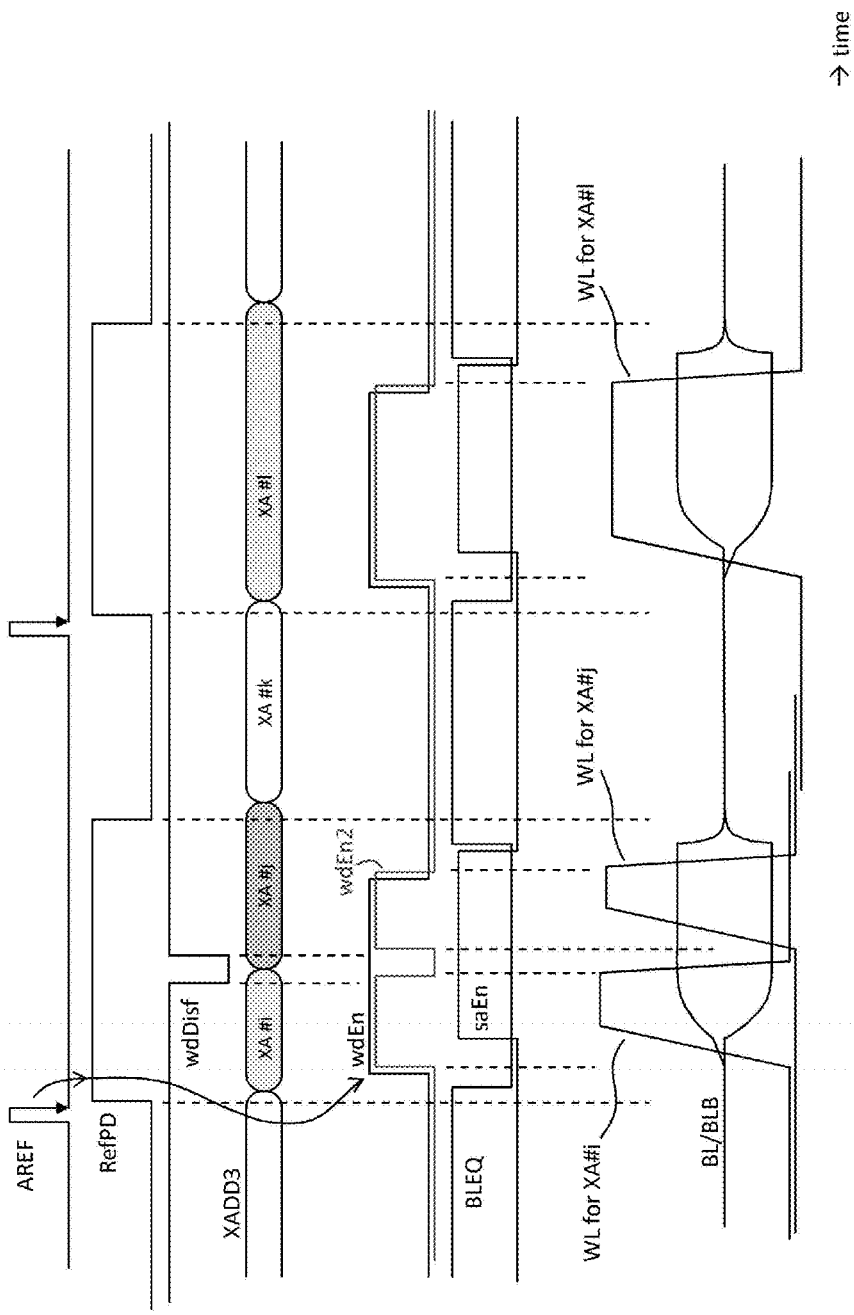
FIG. 9A is an operation waveform chart for describing a basic concept of row copy realization.

For example, a first half of the operations shown in FIG. 9A shows basic waveforms of a row-copy operation. Also in the row-copy operation, similarly, precharge off, word-line actuation, sense-amplifier actuation, etc. are carried out at the timing of internal generation after a refresh command is input. The refresh signal AREF is input from the command decoder 34, this goes through a Row-copy timing generator, and the state signal RefPD, which is continuously activated during a refresh period, is activated. At the same time, the bit-line equalize signal BLEQ is deactivated, the word-line actuation signal wdEn (wdEn2) is activated, and a minute signal caused by charge sharing from memory cells appear in the bit line BL. Subsequently, after a sufficient signal volume appears, the sense-amplifier actuation signal saEn is activated, signal amplification is carried out, and the cell data is precisely read to the bit line BL. Herein, in the row-copy operation, before a transition to the precharge operation (word-line deactivation, sense-amplifier stop, bit-line equalize) is made, the row address is switched, for example, from XA#i to XA#j. Since the row decoder 12B (FIG. 5B) deactivates the word line of XA#i and activates XA#j, the cell data of the row address XA#i is automatically copied to XA#j. After required cell write time, a pre-charge operation is carried out, and the row-copy operation is terminated. Moreover, in simple row-address switching, a glitch may occur in the output of the row decoder 12B (FIG. 5B) in the process thereof, and an unintended word line may be temporarily activated. Therefore, overlapped with the timing of switching the row address, the word-line deactivation signal wdDisf (normally, High) is activated from the row-copy control so that the word line is deactivated during the row-address switching period. According to the present embodiment, only by adding the Row-copy control circuit 126, a conventional row-system circuit can be utilized; and, by switching the row addresses XA#j and XA#i to desired addresses, any row-copy operation (row-copy back operation) or an address replacement operation like that of the row redundancy control circuit 123 can be freely realized.

Figure 8A:
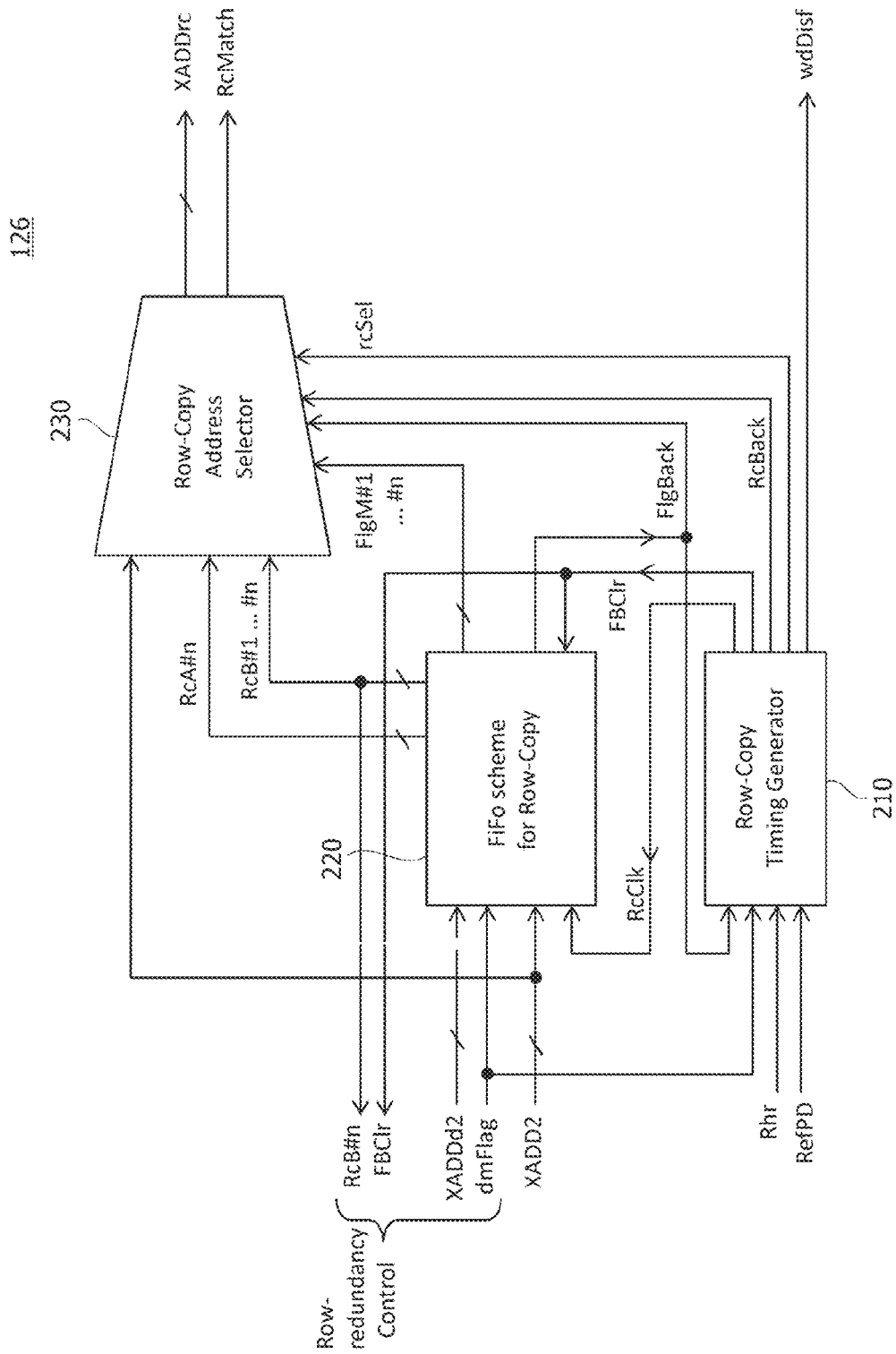
FIG. 8A is a block diagram showing a configuration of a Row-copy control circuit 126.
Figure 8B:
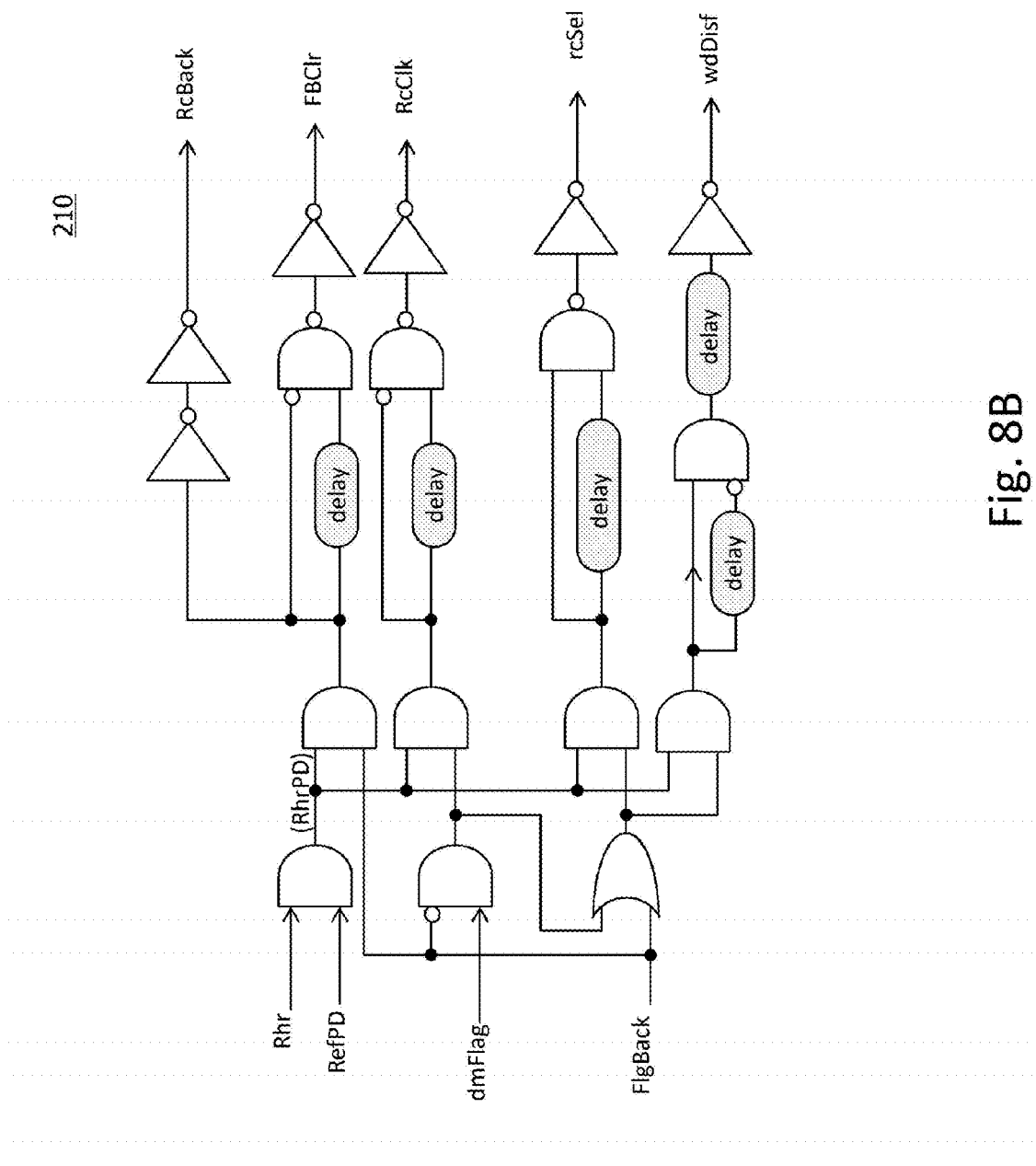
FIG. 8B is a block diagram showing a configuration of a Row-copy timing generator 210.
Figure 8C:
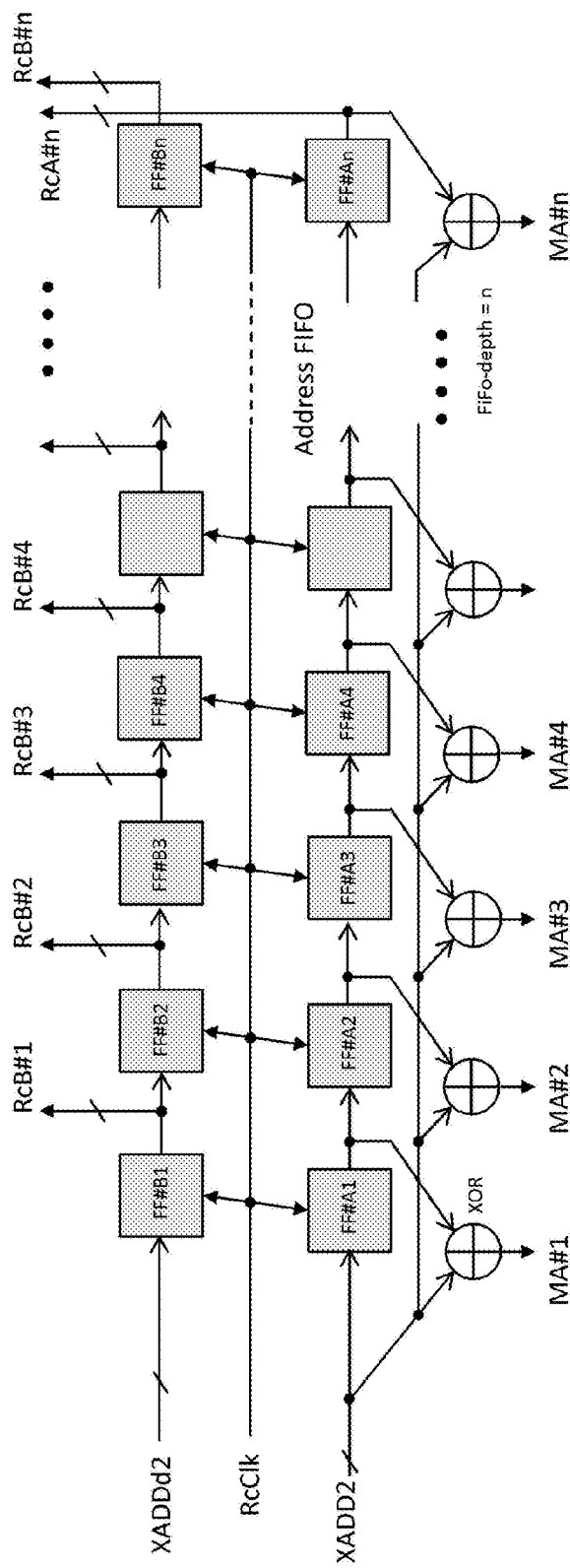
FIG. 8C is a block diagram showing a partial configuration of a FiFo scheme circuit 220.

FIG. 8A is a block diagram showing a configuration of the Row-copy control circuit 126. The Row-copy control circuit 126 is composed of the Row-copy timing generator 210 (FIG. 8B), a FiFo scheme circuit 220 (FIG. 8C and FIG. 8D), and a Row-copy address selector 230 (FIG. 8E).

In the Row-copy timing generator 210 (FIG. 8B), the operation state is judged from input signals, and desired output signals are activated/deactivated at desired timing. For example, both of the state signal Rhr indicating the Row Hammer refresh and the state signal RefPD indicating that refresh is being carried out are activated, an internal signal RhrPD is activated, and various output signals become an activatable state. If a flag signal FlgBack is activated together with activation of RhrPD, a row-copy back operation is judged; and, if the flag signal FlgBack is deactivated and the flag signal dmFlag is activated, a row-copy operation is judged.

If the row-copy back or row-copy operation is judged based on the flag signals FlgBack and dmFlag, a row-copy-address selection signal RcSel and the word-line deactivation signal wdDisf are activated.

The row-copy-address selection signal RcSel is supplied to the Row-copy address selector 230 (FIG. 8E) and realizes active address switching, in other words, supplying of the two addresses required for the row copy (or row-copy back). The row-copy-address selection signal RcSel is an output signal obtained by subjecting the internal signal RhrPD and a largely delayed signal of RhrPD to AND and becomes a pulse signal which is activated in a latter-half period of RhrPD activation.

The word-line deactivation signal wdDisf is supplied to the row decoder 12B (FIG. 5B), and prevents the glitches which occur in active address switching. The word-line deactivation signal wdDisf is an output signal obtained by subjecting the internal signal RhrPD and a somewhat delayed inversion signal of RhrPD to AND, further delaying that by a half period of RhrPD activation, and delaying that; and the word-line deactivation signal wdDisf is an inversion short pulse adjusted so that a deactivation period is overlapped with the time zone in which the row-copy-address selection signal RcSel causes a transition.

Figure 8D:
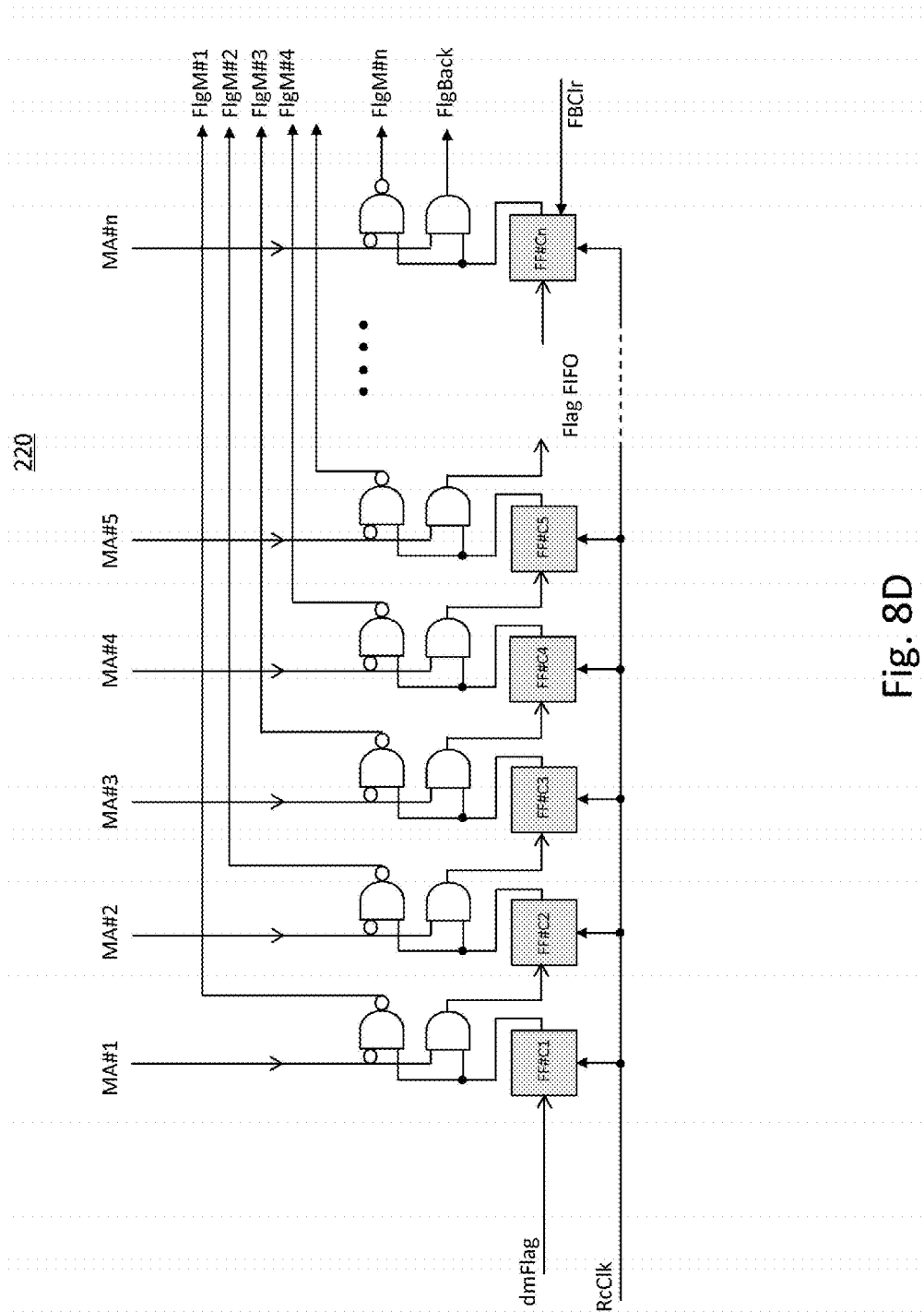
FIG. 8D is a block diagram showing the remaining partial configuration of the FiFo scheme circuit 220.
Figure 8E:
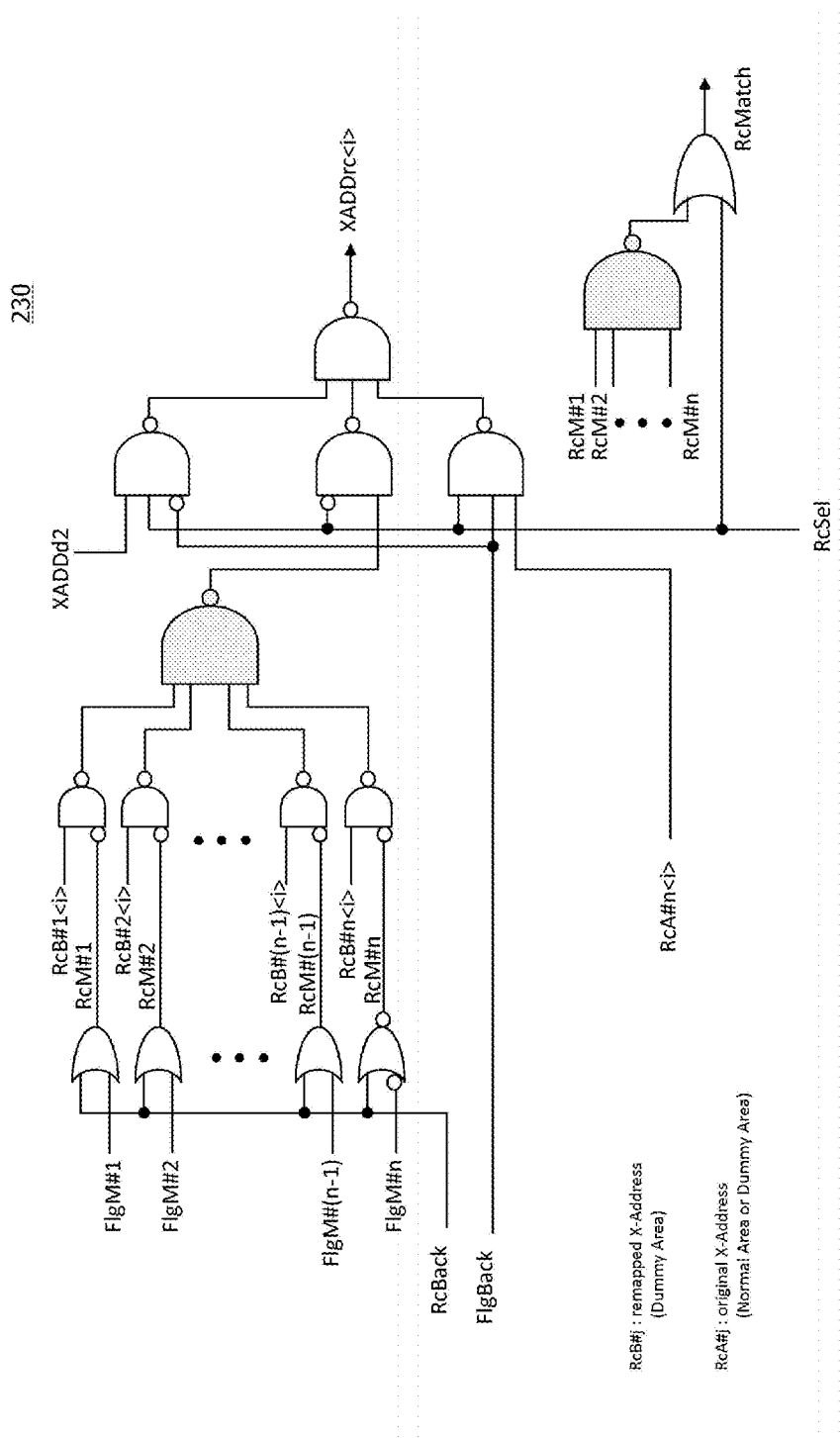
FIG. 8E is a block diagram showing a configuration of a Row-copy address selector 230.

If the row-copy-back flag signal FlgBack supplied from a last stage FF#Cn of a flag FiFo shown in FIG. 8D is activated together with the internal signal RhrPD, a row-copy back operation is carried out. At this point, a row-copy-back state signal RcBack and a row-copy-back flag reset signal FBClr are activated.

The row-copy-back state signal RcBack is a signal similar to RhrPD and is a long pulse which is activated for a comparatively long period in a case of row-copy back. It is supplied to the Row-copy address selector 230 (FIG. 8E) and, in cooperation with the address selection signal RcSel, switches the output row address XADDrc to that for row-copy back.

The row-copy-back flag reset signal FBClr is a signal obtained by subjecting an inversion signal of RhrPD and a somewhat delayed signal thereof to AND and becomes a short pulse which is activated for a short period of time immediately after RhrPD is deactivated. FBClr is fed back to the flag FiFO (FIG. 8D) and resets the flip-flop FF#Cn which is the last stage of the flag FiFO. As a result, the flag signal FlgBack described before is cleared, and a row-copy operation can be carried out thereafter. Although it will be described later in detail, a case in which the data of the last stage FF#Cn of the flag FiFo is High means that an effective row address is stored in the last stage of the FiFO scheme circuit 220 (the row address of the additional region thereof is also being used); therefore, before retrieving new data into the FiFo scheme circuit 220, the cell data of the replacement address (the row address of the additional region thereof) has to be returned to a replacement source address by a row-copy back operation to cause the last stage FF#Cn of the flag FiFO to be Low (vacant). On the other hand, together with FBClr, replacement address information Rc#B in FF#Bn of a FiFO last stage (FIG. 8C) is fed back to the row redundancy control circuit 123 and updates the enable flag information thereof so that the additional region address thereof becomes an unused state. As a result, in a next row-copy operation, the additional region address becomes usable (allocatable) as a replacement address.

If the row-copy-back flag signal FlgBack supplied from the last stage FF#Cn of the flag FiFo (FIG. 8D) is deactivated and if the state flag signal dmFlag of the additional region is activated, a row-copy operation is carried out together with activation of RhrPD. At this point, a clock signal RcClk supplied to the FiFO scheme circuit 220 (FIG. 8C and FIG. 8D) is activated. According to a logic similar to FBClr mentioned above, the clock signal RcClk becomes a short pulse signal which is activated for a short period of time immediately after RhrPD is deactivated. As a result, in the FiFo scheme circuit 220 (FIG. 8C and FIG. 8D), new data is retrieved, and the data of the last stage is erased. On the other hand, RcClk is also supplied to the row redundancy control circuit 123, and the enable flag information of the additional region address XADDd2 retrieved to the FiFO is updated to "used". As a result, in a next row-copy operation, the additional region address becomes unusable (not allocatable) as a replacement address. Unfortunately, if the enable flag information of all the additional region addresses is in a used state and there is no vacancy in the additional region, the flag signal dmFlag is deactivated. In this case, a row-copy operation is not carried out. Including the clock signal RcClk, nothing is activated from the Row-copy timing generator 210 (FIG. 8B), and a simple refresh operation is carried out. However, if the flag signal dmFlag is deactivated, the address scrambler 46 of the refresh address control circuit 40B (FIG. 7) can convert the output thereof from an aggressor address to a victim address. In this case, Row Hammer refresh like that of the first embodiment is carried out.

The FiFo scheme circuit 220 (FIG. 8C and FIG. 8D) stores/manages replacement address information, replacement-source address information, and corresponding flag information (usage state of additional regions) for row-copy/row-copy-back operations. For example, the flag information in a case of High means enabled (used), and the information in a case of Low means disabled (unused). The row-copy/row-copy-back is carried out only in the same section. However, the FiFo scheme circuit 220 (FIG. 8C and FIG. 8D) is not required to be placed for each section, and the single one for at least each bank is enough. The circuit configuration thereof is composed of respectively-corresponding three FiFos (FF#A to FF#C) and a combination logic circuit, and all the FiFos are driven at one time by the synchronization clock signal RcClk. RcClk is a short pulse signal which is generated from the Row-copy timing generator 210 (FIG. 8B) and is activated in the end of a row-copy operation period. Moreover, although they are omitted in FIG. 8C and FIG. 8D, each of the flip-flops has a reset function and is provided with a mechanism which is reset by power supply or a reset command from external input. However, only the last stage FF#Cn of the flag FiFo also has a mechanism which is reset also by the reset signal FBClr. FBClr is a short pulse signal which is activated by the Row-copy timing generator 210 (FIG. 8B) in the end of a row-copy-back operation period.

Meanwhile, the depth n of the FiFo contained in the FiFo scheme circuit 220 corresponds to the number of addresses in the additional region prepared for each section. For example, one bank of a memory array has 32 sections, and each section has an additional region corresponding to 8 addresses; in this case, the additional regions corresponding to 256 addresses in total are physically present, but the depth of FiFo can be 8. As a matter of course, if a circuit area has allowance, the FiFo depth n may exceed 8.

The flat signal FlgBack indicating a necessary state of row-copy back is supplied to the Row-copy timing generator 210 (FIG. 8B), and replacement addresses, replacement-source addresses, and address match information are supplied to the Row-copy address selector 230 (FIG. 8D). The address match information FlgM #1 to n supplied to the Row-copy address selector 230 (FIG. 8D) is the information of individually subjecting the comparison results of the replacement-source addresses (FF #A1 to An) and the sequentially input addresses XADD2 and the flags (FF #C1 to Cn) of the replacement addresses to AND. In other words, this means that which address among the effective replacement-source addresses (FF #A1 to An) has matched XADD2. In the Row-copy address selector 230 (FIG. 8D), based on the address match information Flg M#1 to n, a process of switching the input address XADD2 to the replacement address is carried out.

FIG. 8C shows two address FiFo (FF #A, FF #B) contained in the FiFo scheme circuit 220. The circuit shown in FIG. 8C is composed of: FiFO circuits (FF #A1 to An), which retrieve the input address XADD2 as the replacement-source address; FiFo circuits (FF #B1 to Bn), which retrieve the additional region address XADDd2 as the replacement address; and EXOR circuits, which judge the address match information MA #1 to n. The address match information MA #1 to n means whether the individual replacement-source addresses (FF #A1 to An) matches the input address XADD2 or not.

FIG. 8D shows the flag FiFo (FF #C) contained in the FiFo scheme circuit 220. The circuit shown in FIG. 8D is composed of FiFo circuits (FF #C1 to Cn), which retrieves the state flag signal dmFlag of the additional region as the flag information of the replacement address, and a combination circuit, which determines next flag information. The operation of the address FiFo simply retrieves previous data as next data by sequential shift operations, but the flag FiFO is somewhat different. The first stage FF #C1 retrieves the state flag signal dmFlag of the additional region without change. However, in a second stage and thereafter, And information of the previous flag information and the previous address match information MA #1 to n is retrieved as next flag information.

This flag process is carried out in a below manner. For example, in a case in which a row-copy operation is to be carried out, if at least one of the replacement-source addresses (FF #Ai) stored in the address FiFo and the input address XADD2 matches, first, the corresponding replacement address (FF #Bi) and XADD2 are switched, and a word line of the additional region is activated as a copy source. Then, the additional region address XADDd2 of the same section is newly allocated by the row redundancy control circuit, and another additional-region word line is activated as a copy destination. In other words, the row copy operation is carried out within the additional region. In this case, since the cell data of the additional region address of the copy source is copied to the other additional region address along with address replacement, and, therefore, the flag information of the additional region address of the copy source has to be changed to disabled (Low). In other words, since the address match information MA #i is Low, the next flag information obtained by AND therewith also becomes Low (disabled) (regardless of the previous flag information), and this matches an actual operation.

If the flag information has High (enabled) as the previous state and continues a state of mismatch with the input address XADD2, the flag information maintains High (enabled); however, the information is eventually shifted to the last stage, becomes a target of a row-copy back operation, and changed to Low (disabled). If the flag information (retention data of FF #Cn) of the last stage is High (enabled) and if the replacement-source address (retention data of FF #An) RcA #n is mismatch with the input address XADD2, the flag signal FlgBack output from the last stage of the flag FiFo is activated along with activation of RhrPD (Row Hammer refresh period); and, in the Row-copy timing generator 210 (FIG. 8B), as described before, signal activation for the row-copy back operation is carried out. In the end of the inverse replacement operation of the row address, a clear signal FBClr is activated from the Row-copy timing generator 210 (FIG. 8B), and the last stage FF #Cn of the flag FiFo is updated to Low (disabled). As a result, vacancy is recovered in the additional array region for a next row-copy operation.

However, even in a case in which the flag information maintains High (enabled) in the last stage, if the next input address XADD2 incidentally matches the replacement-source address RcA #n of the FiFo last stage, the copy-back flag signal FlgBack is deactivated since the address match information MA #n becomes Low, and a row-copy back operation is not carried out. As well as the case described above in which address match occurs, a row-copy operation is carried out within the additional region. First, the input address XADD2 is switched to the replacement address RcB #n, and a word line of the additional region thereof is activated as a copy source. Then, the additional region address XADDd2 of the same section is newly allocated by the row redundancy control circuit 123, and another additional-region word line is activated as a copy destination. (In other words, a row-copy operation within the additional region.) In the end of the row-copy operation, the clock signal RcClk is activated from the Row-copy timing generator 210 (FIG. 8B), a FiFo shift operation is carried out, wherein the data of the FiFo last stage, which is the copy source, is transferred to the FiFo first stage. To the FiFo last stage (#n), the data (#n−1) immediately adjacent thereto is transferred, and the data thereof appears to be erased. However, in the FiFo first stage, the input address XADD2 is input to the replacement-source address, which is the same as the previous last stage RcA #n. In other words, storage/management in the FiFo block with respect to the row address is continued. XADDd2 (copy destination address) and dmFlag (=High) newly supplied from the row redundancy control circuit 123 are input to and update the replacement address and the flag information.

In order to realize address supply of the row-copy/row-copy-back operation, the Row-copy address selector 230 (FIG. 8E) switches the address value of the row-copy address XADDrc depending on the respective operations, activates the row-copy match signal RcMatch, and, in coordination, carries out address switching in the third multiplexer 127 (FIG. 5B). The address selection signal RcSel and the row-copy-back signal RcBack are input from the Row-copy timing generator 210 (FIG. 8B), the newly allocated additional region address XADDd2 is from the row redundancy control circuit 123 (FIG. 5B), and the row-copy-back flag signal FlgBack, the replacement addresses RcB #1 to n, the replacement-source address RcA #n of the last stage, and the address match information FlgM #1 to n are input from the FiFo scheme circuit 220 (FIG. 8C and FIG. 8D).

In a case of a normal active operation or a refresh operation, the address selection signal RcSel, the row-copy-back signal RcBack, and the row-copy-back flag signal FlgBack remain deactivated. If the input address XADD2 does not match any of the addresses in the FiFo scheme circuit 220, there is no address switching with no change, the row address XADD3 is the same ad remains to be XADD2, and the active operation or the refresh operation is carried out. If the input address XADD2 matches any of the (enabled) addresses in the FiFo scheme circuit 220, any of the address match information FlgM #1 to n is activated. As a result, first, any of the corresponding address match information RcM #1 to n in the Row-copy address selector 230 is activated, and the row-copy match signal RcMatch is activated. The row address XADD3 is switched to XADDrc, which is supplied from the Row-copy address selector 230, at the third multiplexer 127 (FIG. 5B). Like the row redundancy control circuit 123, the input address XADD2 is switched to the address XADDrc (the address-matched replacement address), and the active operation or the refresh operation is carried out (latter half of FIG. 9C).

In a case of the row-copy operation, the row-copy-back signal RcBack and the row-copy-back flag signal FlgBack remain deactivated. As described above (FIG. 8B), the address selection signal RcSel is activated in the latter half of the row-copy operation period (RhrPD activation period). The row-copy match signal RcMatch is also activated in the latter half of the row-copy operation period (RhrPD activation period), and address selection (XADD3) is switched from the input address XADD2 to the newly-allocated additional region address XADDd2. As a result, the row-copy operation that uses the copy source XADD2 and the copy destination XADDd2 is realized.

Meanwhile, incidentally, if the input address XADD2 matches any of the (enabled) addresses in the FiFo scheme circuit 220, any of the address match information FlgM #1 to n is activated. As described above, the row-copy match signal RcMatch is activated, any of the replacement addresses RcB #1 to n corresponding to the activation is selected, and the input address is switched from XADD2 to XADDrc serving as a replacement address. Next, in the latter half of the row-copy operation period (RhrPD activation period), the address selection signal RcSel is activated, and the row-copy address XADDrc is switched to the newly allocated additional region address XADDd2. As a result, the row-copy operation using the replacement address (any of RcB #1 to n) of XADD2 as the copy source and using the copy destination XADDd2 is realized. This is the row-copy operation within the additional region.

In the case of the row-copy back operation, the row-copy-back flag signal FlgBack is in an activated state, and in the row-copy-back operation period (RhrPD activation period), the row-copy-back signal RcBack is activated. The address selection signal RcSel is activated in the latter half of the row-copy-back operation period (RhrPD activation period). First, activation of the row-copy-back signal RcBack forcibly activates the address selection flag RcM #n of the FiFo last stage. At the same time as activation of the row-copy match signal RcMatch, the replacement address RcB #n of the FiFo last stage is selected as a match address and becomes the row-copy address XADDrc. As a result, the row address XADD3 is switched to the replacement address RcB #n (FiFo last stage). In the latter half of the row-copy back operation period (RhrPD activation period), the address selection signal RcSel is activated, and the row-copy-back flag signal FlgBack is in an activated state; therefore, XADDrc is switched to the replacement-source address RcA #n of the FiFo last stage. As described above, the row-copy-back operation using the replacement address RcB #n (FiFo last stage) as the copy source and using the replacement-source address RcA #n (FiFo last stage) as the copy destination is realized.

Moreover, incidentally, if the input address XADD2 matches the replacement-source address RcA #n of the FiFo-block last stage, as shown in the FiFo scheme circuit 220 (FIG. 8D), the row-copy-back flag signal FlgBack becomes a deactivated state, and the row-copy-back signal RcBack is also deactivated. In this case, as described above, a row-copy operation within the additional region according to activation of the address match information FlgM #n (FiFo last stage) is carried out.

Next, by using the operation waveforms of the row-copy operation shown in FIG. 9A, a basic concept of row-copy realization will be described.

For example, a refresh command is input, and the refresh signal AREF is output from the command decoder 34. The refresh signal AREF is input to the Row activation timing generator 121 (FIG. 5B), activates a refresh operation period and the pulse signal RefPD to be activated, and it is distributed to pulse signal multiplexer 122, the row redundancy control circuit 123, and the Row-copy control circuit 126. Moreover, as well as a normal refresh operation, various signals required for row activation, i.e., BLEQ (bit-line equalize), wdEn (word-line activation), saEn (sense-amplifier actuation), etc. are activated from the Row activation timing generator 121 (FIG. 5B). In coordination, two addresses XA #i and XA #j are supplied from the Row-copy control circuit 126 to the X address decoder 125.

As a result, word-line selection is automatically changed, and the activated word line is switched from XA #i to XA #j. However, overlapped with the switching period of the address, the word-line deactivation signal wdDisf is supplied to prevent glitches of the address decoder which may occur in the switching process and prevent activation of unintended row addresses. When the word-line deactivation signal is supplied together with the two address supply from the row copy control in this manner, a conventional row-system circuit can be utilized, and the need of large-scale changes can be eliminated. Moreover, the time of switching to the next row address XA #j is not required to wait for the sense amplifier for the first row address XA #i to be actuated and cause a bit-line amplitude to be full; and, even when the switching is started, for example, at a degree of about 50%, the row-copy operation can be normally carried out without affecting the signal amplification operation. In other words, the time required for the row copy can be caused to be equivalent to normal refresh.

Figure 9B:
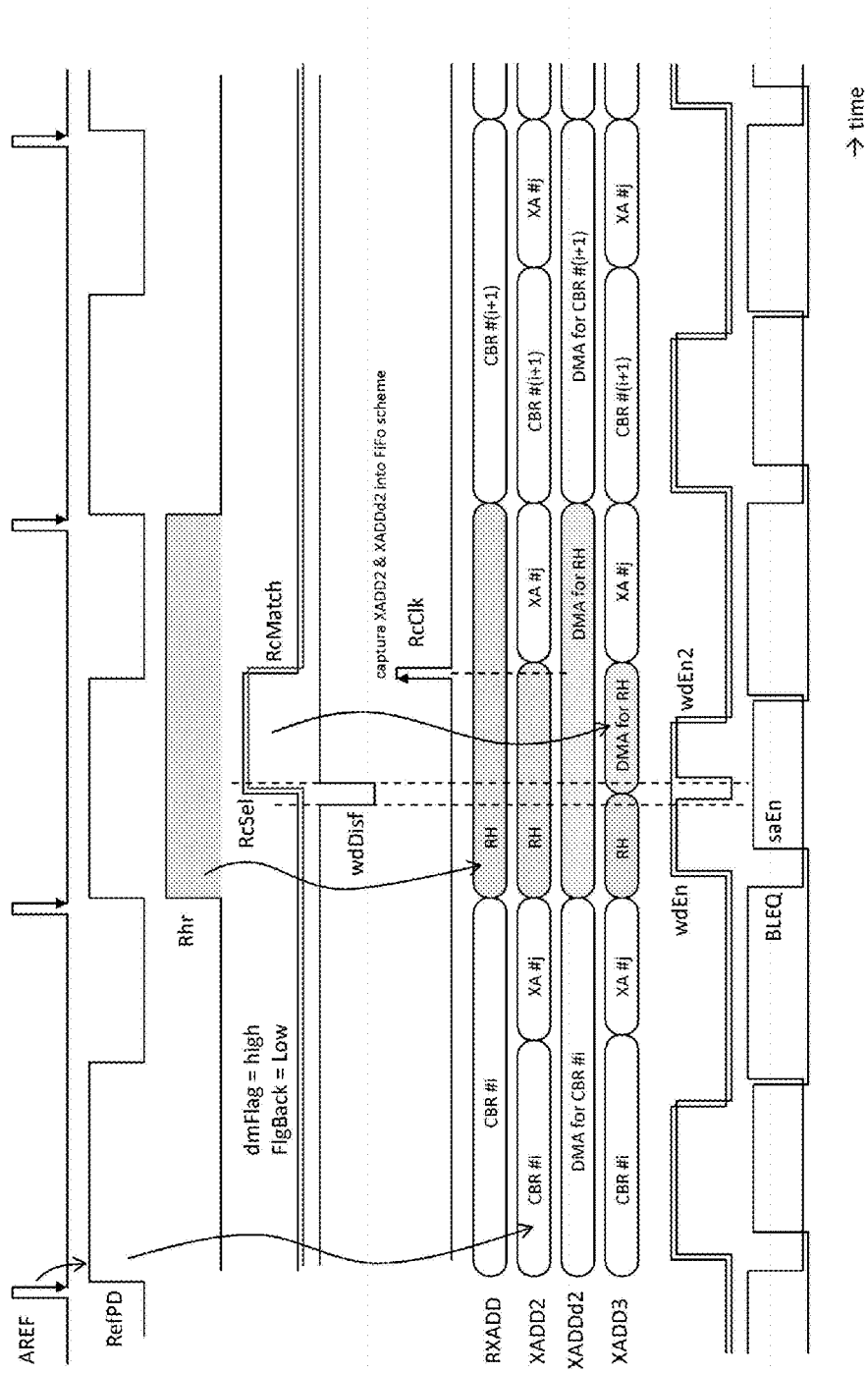
FIG. 9B is an operation waveform chart for describing a copy operation from a normal array to an additional region.

Next, by using the operation waveforms of the row-copy operation shown in FIG. 9B, a copy operation from a normal array to an additional region will be described.

For example, a refresh command is input, and the refresh signal AREF is output from the command decoder 34. The Rhr signal is activated from the refresh cycle generator 48, and the period of Row Hammer refresh is started. In the Row-copy control circuit 126, RhrPD is activated from the Row-copy timing generator 210 (FIG. 8B), (the copy-back flag signal FlgBack is in a deactivated state), and a row-copy operation is carried out. First, the refreshing address RXADD is switched to an extracted Row Hammer aggressor address RH according to a refresh counter value (FIG. 7). The address XADD2 which has passed through the row redundancy control circuit 123 becomes RH, and the additional region address XADDd2 (of the same section as the aggressor address RH) and the flag information dmFlag (=High) thereof are supplied to the row copy control. From the Row-activation timing generator, BLEQ is deactivated, wdEn is activated, a pre-charge state is cancelled, and the word line of the row address RH is actuated. Subsequently, saEn is activated, and the sense amplifier is actuated. After a while, the address selection signal RcSel and the row-copy match signal RcMatch are activated, and the row address is switched to the previous additional region address XADDd2 (DMA for RH). Moreover, overlapped with the switching time thereof, during this period, the word deactivation signal wdDisf is activated to prevent occurrence of glitches. As a result, cell data is copied from the row address RH to the additional region address XADDd2 (DMA for RH). In the end, various signals, i.e., wdEn, saEn, and BLEQ are deactivated, and the memory array becomes a pre-charge state (standby state). In coordination, the clock signal RcClk is activated, the previous replacement address (DMA for RH), the replacement-source address RH, and the flag information dmFlag are retrieved to the FiFo scheme circuit 220 (FIG. 8C and FIG. 8D), and the operation is completed.

Next, by using the operation waveforms of a row-copy-back operation shown in FIG. 9C, a copy operation from an additional region to a normal array will be described.

For example, a refresh command is input, and the refresh signal AREF is output from the command decoder 34. The Rhr signal is activated from the refresh cycle generator 48, and the period of Row Hammer refresh is started. The copy-back flag signal FlgBack is in an activated state, and a copy-back operation is carried out. First, as well as the row-copy operation, the refreshing address RXADD is switched to an extracted Row Hammer aggressor address RH according to a refresh counter value (FIG. 7). The address XADD2, which has passed through the row redundancy control circuit 123, becomes RH, and the additional region address XADDd2 (of the same section as the aggressor address RH) and the flag information dmFlag thereof are supplied to the row copy control. However, in the row-copy-back operation, this input information is not used. In response to activation of the copy-back flag signal FlgBack, during that operation period, the copy-back signal RcBack is activated from the Row-copy timing generator 210 (FIG. 8B). From the Row-copy address selector 230 (FIG. 8E), the address match flag RcM #n of the FiFo block last stage is forcibly activated, and the replacement address RcB #n is selected as the row-copy address XADDrc. At the same time, in coordination with the copy-back signal RcBack, the row-copy match signal RcMatch is activated. As described above, the row address XADD3, which has been through the third multiplexer 127, becomes the replacement address RcB #n (additional region address). From the Row activation timing generator 121, BLEQ is deactivated, wdEn is activated, a pre-charge state is cancelled, and the word line of the replacement address RcB #n is activated. Subsequently, saEn is activated, and the sense amplifier is actuated. After a while, the address selection signal RcSel is activated, and the row-copy address XADDrc is switched to the replacement-source address RcA #n (normal region address) of the FiFo last stage. Meanwhile, overlapped with the switching time, during this period, the word deactivation signal wdDisf is activated to prevent glitch occurrence. As a result, cell data is copied (inverse replacement operation) from the additional region address RcB #n (replacement address) to the normal region address RcA #n (replacement-source address). In the end, various signals wdEn, saEn, and BLEQ are deactivated, and the memory array becomes a pre-charge state (standby state). In coordination, the clear signal FBClr is activated, the last stage FF #Cn of the flag FiFo 220 (FIG. 8D) is reset, and the FiFo block last stage is updated to be disabled, in other words, vacant (Low). As a result, a next row-copy operation can be carried out, and the row-copy-back operation is completed.

Figure 9D:
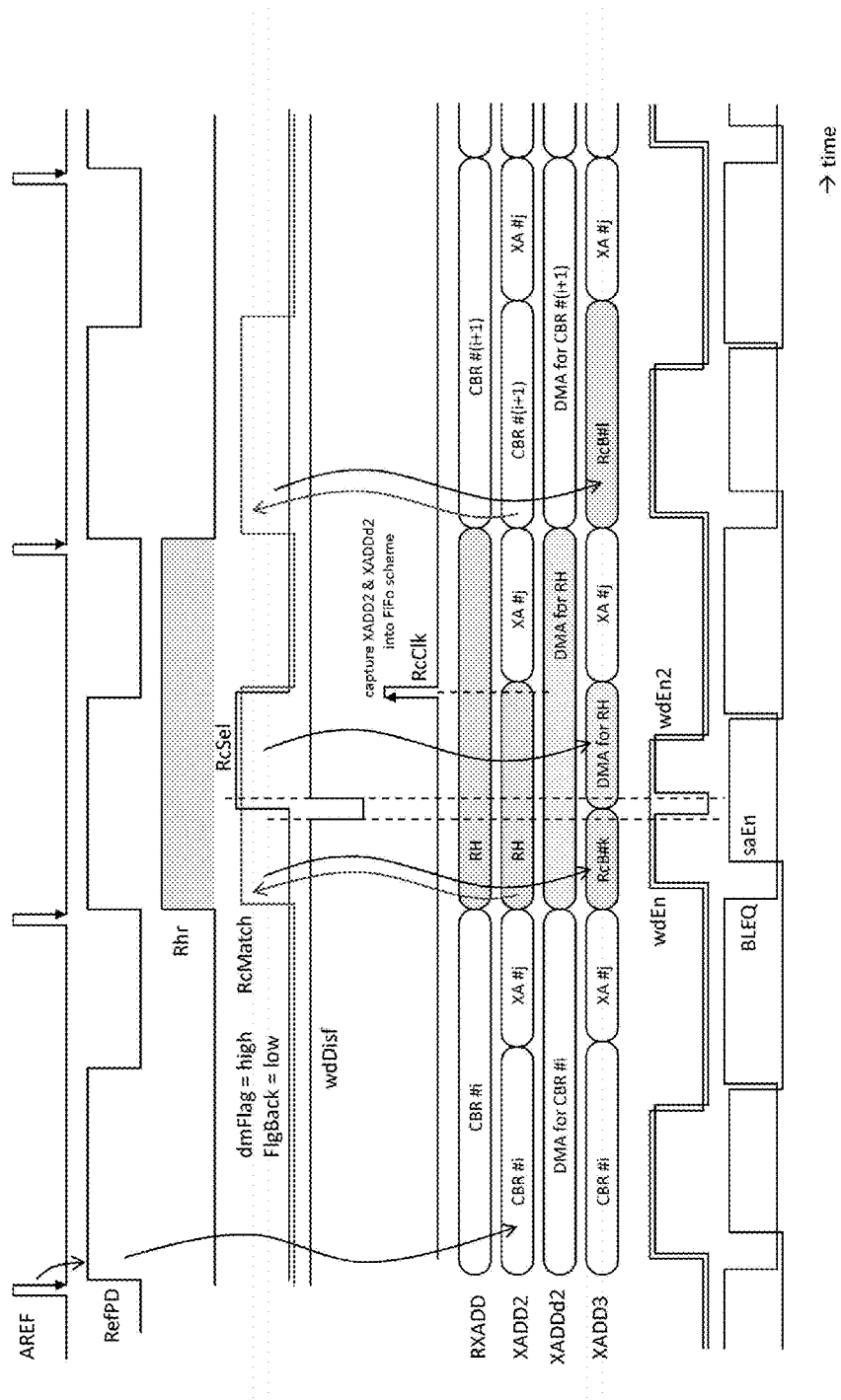
FIG. 9D is an operation waveform chart for describing a copy operation from an additional region to the additional region

Next, by using operation waveforms of a row-copy operation shown in FIG. 9D, a copy operation from an additional region to the additional region will be described.

For example, a refresh command is input, and the refresh signal AREF is output from the command decoder 34. From the refresh cycle generator 48, the Rhr signal is activated, and the period of Row Hammer refresh is started. When the copy-back flag signal FlgBack is in a deactivated state, a row-copy operation is carried out. First, the refreshing address RXADD is switched to an extracted Row Hammer aggressor address RH according to a refresh counter value (FIG. 7). The address XADD2, which has passed through the row redundancy control circuit 123, becomes RH, and the additional region address XADDd2 (of the same section as the aggressor address RH) and the flag information dmFlag (=High) thereof are supplied to the row copy control. Herein, incidentally, if the hammer address RH (=XADD2) matches any of the replacement-source addresses RcA #k stored in the FiFo scheme circuit 220 (FIG. 8C), (if "the hammer address RH"="the replacement-source address RcA #k"), the replacement address RcB #k is selected in the Row-copy address selector 230 (FIG. 8E) according to the activated address match signal FlgM #k and becomes the row address XADDrc, and, at the same time, the row-copy match signal RcMatch is activated. The row address XADD3, which has been through the third multiplexer 127, becomes the replacement address RcB #k instead of the hammer address RH (=XADD2). From the Row activation timing generator 121, BLEQ is deactivated, wdEn is activated, a pre-charge state is cancelled, and the word line of the replacement address RcB #k (additional region address) is activated. Subsequently, saEn is actuated, and cell data is read to a bit line. After a while, the address selection signal RcSel is activated, and the row-copy address XADDrc is switched to the additional region address XADDd2 (DMA for RH) allocated for the hammer address RH (=XADD2). Moreover, overlapped with the switching time thereof, during this period, the word deactivation signal wdDisf is activated to prevent glitch occurrence. As a result, the cell data is copied from the additional region address RcB #k to the additional region address XADDd2 (DMA for RH). In other words, this is a row-copy operation within the additional region. In the end, various signals wdEn, saEn, and BLEQ are deactivated, and the memory array becomes a pre-charge state (standby state). In coordination, the clock signal RcClk is activated, and the previous replacement address (DMA for RH), the replacement-source address RH (=RcA #k), and the flag information dmFlag are retrieved to the FiFo scheme circuit 220 (FIG. 8C and FIG. 8D), and the operation is completed.

In the end, advantages of the row-copy/copy-back method will be collectively described.

Hereinabove, the embodiment of the row-copy/copy-back operations has been described, and a point to be focused on herein is the address match mechanism of the FiFo scheme circuit 220 (FIG. 8C and FIG. 8D). If an address match occurs in the FiFo scheme circuit 220 and a row-copy/copy-back operation is to be carried out in the additional region, the replaced row address is not returned to the normal region, and the row address is dynamically switched within the additional region. If this state endlessly continues, the Row Hammer aggressor address is no longer an aggressor address endlessly, and large Row Hammer tolerance can be exerted. Moreover, hammer addresses have a high appearance probability and have a high probability of causing address matches; therefore, the row addresses are selected so that the hammer addresses stay long in the additional region. In other words, the row copy control of the present proposition per se has a hammer-address detection ability in addition to replacement of the Row Hammer refresh by the row-copy operation. This is implemented since match detections (EXOR) of the plurality of addresses accumulated in FiFo and the input addresses are carried out as well as the refresh address control circuit 40A or 40B (FIG. 2A or FIG. 7). Therefore, if this is used in combination with the refresh address control circuit 40A or 40B (FIG. 7) like that of the first embodiment, an extremely high hammer address detection ability is provided like the 2-stage FiFo configuration (FIG. 4). In a way, the second embodiment can be said to be a modification example of the 2-stage FiFo configuration (FIG. 4) to which the advantages as described above exerted by replacing the Row Hammer refresh by the row-copy operation (for example, HC tolerance improvement of the row-system circuit caused by row-access distribution) are added.

In this manner, if the interrupt cycle signal Rhr is activated, in addition to the normal refresh operation, the row-copy back operation of recovering vacancy in the additional word line DWL contained in the additional array region 72, and the row-copy operation of allocating the address of the word line WL contained in the normal array region 71 to the additional word line DWL contained in the additional array region 72 are executed.

In this manner, in the present embodiment, since the physical positions of the word lines that have high access frequencies are dynamically changed, the number of times of access with respect to the same word line WL is reduced. As a result, in the word line(s) WL related to (mainly adjacent to) the word line WL having the high access frequency, the data retention characteristics is less likely to be deteriorated. Furthermore, the effect of reliability improvement including HC tolerance improvement of the row-system circuit is also added.

Hereinabove, the preferred embodiment of the present invention have been described. However, the present invention is not limited to the above described embodiments, various modifications can be made within a range not departing from the gist of the present invention, and it goes without saying that they are also included in the scope of the present invention.

REFERENCE SIGNS LIST 10A, 10B semiconductor device
11 memory cell array
12A, 12B row decoder
13 column decoder
14 read/write amplifier
15 input/output circuit
21 address terminal
22 command terminal
23 clock terminal
24 data terminal
25 data mask terminal
26, 27 power supply terminal
31 address input circuit
32 address output circuit
33 command input circuit
34 command decoder
35 clock input circuit
36 internal clock generator
37 voltage generator
40A, 40B refresh address control circuit
41 sampling signal generator
42 shift register
43 NAND gate circuit
44 AND gate circuit
45 latch circuit
46 address scrambler
47 refresh counter
48 refresh cycle generator
49 multiplexer
71 normal array region
72 additional array region
121 Row activation timing generator
122 multiplexer
123 row redundancy control circuit
124 multiplexer
125 X address decoder
126 Row-copy control circuit
127 multiplexer
128 AND gate circuit
210 Row-copy timing generator
220 FiFo scheme circuit
230 Row-copy address selector
411 pseudo-random generator
412 counter circuit
413 exclusive OR gate circuit
414 AND gate circuit
415 counter circuit 416 exclusive OR gate circuit
417 AND gate circuit
481 counter circuit
482 shift register
483 logic circuit
BL bit line
BL1, BL2 detected block
DWL additional word line
FF, FFA, FFB flip-flop circuit
MC memory cell
Region 0 to Region 3 array region
SAMP sense amplifier
TG transfer gate
WL word line
XOR1 to XORn comparator circuit

What is claimed is:

1. An apparatus comprising:
a plurality of memory cells;
a plurality of word lines each coupled to a corresponding one of the plurality of memory cells; and
a control circuit configured to monitor accesses to the plurality of word lines intermittently and further configured to detect if a first number of accesses have been issued to one of the plurality of word lines in a first period of time,
wherein the control circuit includes a signal generator configured to receive a first control signal activated when the plurality of word lines are accessed and further configured to activate a second control signal when the first control signal is activated by the first number of times.

2. The apparatus of claim 1, further comprising an address output circuit configured to provide an address of the word line serving as an access target, wherein the control circuit includes:
a latch circuit configured to intermittently latch the address output from the address output circuit; and
a comparator circuit configured to intermittently compare the address output from the address output circuit and the address latched by the latch circuit.

3. The apparatus of claim 2,
wherein the latch circuit is further configured to carry out a latch operation in response to activation of the second control signal.

4. The apparatus of claim 3, wherein the comparator circuit is further configured to carry out a comparison operation in response to the activation of the second control signal.

5. The apparatus of claim 1, wherein the control circuit is configured to activate an other of the word lines related to and different from the one of the word lines, in response to the first number of accesses to the one of the word lines in the first period of time.

6. The apparatus of claim 1, wherein the control circuit is configured to change an address of the one of the word lines, in response to the first number of accesses to the one of the word lines in the first period of time.

7. The apparatus of claim 6, wherein the control circuit is configured to exchange the address of the one of the word lines and the address of an other of the word lines different from the address of the one of the word lines, in response to the first number of accesses to the one of the word lines in the first period of time.

8. An apparatus comprising:
a plurality of word lines having mutually different allocated addresses;
an address output circuit configured to provide the address;
a row decoder configured to access any of the plurality of word lines indicated by the address in response to a first control signal;
a first latch circuit configured to latch the address in response to a second control signal different from the first control signal;
a first comparator circuit configured to compare the address output from the address output circuit and the address latched by the first latch circuit in response to the second control signal, and
wherein the second control signal is less frequently activated than the first control signal.

9. The apparatus of claim 8, wherein
the second control signal is activated in response to the first control signal being activated by a first number of times.

10. An apparatus comprising:
a plurality of word lines having mutually different allocated addresses;
an address output circuit configured to provide the address;
a row decoder configured to access any of the plurality of word lines indicated by the address in response to a first control signal;
a first latch circuit configured to latch the address in response to a second control signal different from the first control signal;
a first comparator circuit configured to compare the address output from the address output circuit and the address latched by the first latch circuit in response to the second control signal; and
an address scrambler configured to generate an additional address related to and different from the address latched by the first latch circuit in response to activation of a third control signal when the address from the address output circuit and the address latched by the first latch circuit match.

11. The apparatus of claim 10, wherein an other of the word lines to which the additional address is allocated is activated in response to a fourth control signal activated in response to a refresh command.

12. The semiconductor device according to claim 8, wherein
the address of a first word line and the address of a second word line are exchanged in response to activation of a third control signal.

13. The semiconductor device according to claim 12, wherein
the address of the first word line is the address latched by the first latch circuit.

14. An apparatus comprising:
a plurality of word lines having mutually different allocated addresses;
an address output circuit configured to provide the address;
a row decoder configured to access any of the plurality of word lines indicated by the address in response to a first control signal;
a first latch circuit configured to latch the address in response to a second control signal different from the first control signal;
a first comparator circuit configured to compare the address output from the address output circuit and the address latched by the first latch circuit in response to the second control signal;

a second latch circuit configured to latch the address output from the address output circuit in response to activation of the third control signal; and a second comparator circuit configured to compare the address from the address output circuit and the address latched by the second latch circuit in response to the third control signal.

\* \* \* \* \*